US010158716B2

(12) United States Patent
Paridel et al.

(10) Patent No.: US 10,158,716 B2
(45) Date of Patent: Dec. 18, 2018

(54) SIMULATION OF VEHICLE TELEMATICS EVENTS

(71) Applicant: MOJ.IO INC., Vancouver (CA)

(72) Inventors: Pooya Paridel, Vancouver (CA); Robert Chartier, Burnaby (CA); Connery Noble, Vancouver (CA)

(73) Assignee: MOJ.IO INC., Vancouver (CA)

( * ) Notice: Subject to any disclaimer, the term of this patent is extended or adjusted under 35 U.S.C. 154(b) by 396 days.

(21) Appl. No.: 14/976,941

(22) Filed: Dec. 21, 2015

(65) Prior Publication Data
US 2017/0178419 A1 Jun. 22, 2017

(51) Int. Cl.
G07C 5/08 (2006.01)
G06F 17/50 (2006.01)
H04L 29/08 (2006.01)

(52) U.S. Cl.
CPC .......... *H04L 67/12* (2013.01); *G06F 17/5009* (2013.01); *G06F 17/5095* (2013.01); *G07C 5/0808* (2013.01)

(58) Field of Classification Search
CPC .... G07C 5/008; G06F 17/5009; G05B 13/041
USPC .......................................................... 703/17
See application file for complete search history.

(56) References Cited

U.S. PATENT DOCUMENTS

| 6,127,947 | A  | * | 10/2000 | Uchida | B60G 17/0195 |
| | | | | | 340/439 |
| 6,507,810 | B2 | * | 1/2003 | Razavi | G01C 21/26 |
| | | | | | 703/23 |
| 6,754,183 | B1 | * | 6/2004 | Razavi | G01C 21/26 |
| | | | | | 370/254 |
| 8,560,609 | B2 | * | 10/2013 | Nathanson | G07C 5/008 |
| | | | | | 370/341 |
| 8,626,152 | B2 | * | 1/2014 | Farrell | H04W 76/10 |
| | | | | | 455/426.1 |

(Continued)

OTHER PUBLICATIONS

Yoon et al. ("Attention Based Driving Event Simulator for Telematics Environment", ICACT, 2009, pp. 757-759).*

(Continued)

*Primary Examiner* — Kamini S Shah
*Assistant Examiner* — Iftekhar A Khan
(74) *Attorney, Agent, or Firm* — Alleman Hall Creasman & Tuttle LLP

(57) ABSTRACT

Simulation of vehicle telematics events is provided by a vehicle telematics simulator. The simulator performs a simulation of vehicle telematics events based on user-defined parameters to generate simulation data. The simulation data is formatted according to a reporting protocol to obtain formatted simulation data. The reporting protocol may be the same reporting protocol used by vehicle-based telematics devices to format and report measurement data for real-world vehicle telematics events. The formatted simulation data is provided to a vehicle telematics service hosted at a server system for processing. The formatted simulation data is processed along with formatted measurement data representing measurements of real-world telematics events via a common processing pipeline of the vehicle telematics service. The vehicle telematics simulator may reside at a client computing device or at the server system that hosts the vehicle telematics service.

20 Claims, 10 Drawing Sheets

(56) References Cited

U.S. PATENT DOCUMENTS

| | | | |
|---|---|---|---|
| 9,444,892 B1* | 9/2016 | Amireddy | H04W 76/10 |
| 9,628,599 B2* | 4/2017 | Farrell | H04W 76/10 |
| 9,883,353 B2* | 1/2018 | Ng | H04W 4/046 |
| 2002/0173889 A1* | 11/2002 | Odinak | B60R 11/02 |
| | | | 701/36 |
| 2003/0182027 A1* | 9/2003 | Mocek | H04L 29/06 |
| | | | 701/1 |
| 2003/0182577 A1* | 9/2003 | Mocek | G06F 21/51 |
| | | | 726/26 |
| 2006/0293813 A1* | 12/2006 | Nou | G07C 5/008 |
| | | | 701/31.4 |
| 2007/0156311 A1* | 7/2007 | Elcock | G07C 5/008 |
| | | | 701/31.4 |
| 2008/0004788 A1* | 1/2008 | Dorfstatter | G01C 21/26 |
| | | | 701/117 |
| 2009/0287499 A1* | 11/2009 | Link, II | G06Q 30/018 |
| | | | 705/317 |
| 2010/0035602 A1* | 2/2010 | Doherty | H04W 48/16 |
| | | | 455/425 |
| 2010/0228404 A1* | 9/2010 | Link, II | G06F 9/44542 |
| | | | 701/1 |
| 2010/0235891 A1* | 9/2010 | Oglesbee | H04L 67/1095 |
| | | | 726/5 |
| 2011/0153367 A1* | 6/2011 | Amigo | G06Q 40/08 |
| | | | 705/4 |
| 2011/0234427 A1* | 9/2011 | Ingram | G08G 1/20 |
| | | | 340/995.1 |
| 2012/0101855 A1* | 4/2012 | Collins | G06Q 40/08 |
| | | | 705/4 |
| 2013/0024060 A1* | 1/2013 | Sukkarie | G01C 21/26 |
| | | | 701/22 |
| 2013/0079964 A1* | 3/2013 | Sukkarie | G01C 21/3469 |
| | | | 701/22 |
| 2013/0090782 A1* | 4/2013 | Yi | H04L 69/22 |
| | | | 701/2 |
| 2013/0204466 A1* | 8/2013 | Ricci | G06F 17/00 |
| | | | 701/2 |
| 2013/0204484 A1* | 8/2013 | Ricci | G06F 17/00 |
| | | | 701/29.4 |
| 2013/0204943 A1* | 8/2013 | Ricci | G06F 3/0484 |
| | | | 709/204 |
| 2013/0289819 A1* | 10/2013 | Hassib | G06F 17/00 |
| | | | 701/29.6 |
| 2014/0096217 A1* | 4/2014 | Lehmann | H04L 63/08 |
| | | | 726/7 |
| 2014/0213238 A1* | 7/2014 | Giraud | G07C 5/008 |
| | | | 455/418 |
| 2015/0278150 A1* | 10/2015 | Bellanca | B60K 37/06 |
| | | | 381/302 |
| 2016/0232721 A1* | 8/2016 | Singh | G07C 5/0825 |

OTHER PUBLICATIONS

Kim et al. ("Development of a Telematics Evaluation Environment Based on a Driving Simulator and Its Application", International Journal of Automotive Technology, vol. 12, No. 5, pp. 755-762 (2011).*

Koo et al. ("Development of a driving simulator for telematics human-machine interface studies", JAUTO863 F IMechE 2008, pp. 2077-2085).*

Cho et al. ("Overview of Telematics: A System Architecture Approach", International Journal of Automotive Technology, vol. 7, No. 4, pp. 509-517 (2006)).*

* cited by examiner

SIMULATION OF VEHICLE TELEMATICS EVENTS

BACKGROUND

Many modern vehicles include on-board electronic control systems that manage, measure, and report operation of the vehicle's various subsystems. On-board electronic control systems may include or otherwise support on-board diagnostic (OBD) services that enable vehicle owners and repair technicians to access diagnostic information or other forms of operational information from the control system. As one example, on-board electronic control systems of a vehicle may be accessed via a data interface in the form of a physical wired data link connector or data port. OBD information may be communicated over this data interface using a variety of protocols, including ALDL, OBD-I, OBD-1.5, OBD-II, etc.

SUMMARY

Simulation of vehicle telematics events is provided by a vehicle telematics simulator. A vehicle telematics event includes the existence or presence of a vehicle state (e.g., an idling state or a cruising state) or a transition between two or more vehicle states (e.g., engine starting from a non-operational state to an operational state). In an example, the vehicle telematics simulator receives user input defining a set of parameters for a simulation of one or more vehicle telematics events. The vehicle telematics simulator performs the simulation of vehicle telematics events based, at least in part, on the set of parameters defined by the user input to generate simulation data. The simulation data generated by the vehicle telematics simulator is formatted according to a reporting protocol to obtain formatted simulation data. The reporting protocol may be the same reporting protocol used by vehicle-based telematics devices to format and report measurement data representing measurements of real-world vehicle telematics events. The formatted simulation data is provided to a vehicle telematics service hosted at a server system for processing by the vehicle telematics service.

The vehicle telematics service hosted at the server system obtains the formatted simulation data, and additionally obtains formatted measurement data representing measurements of real-world vehicle telematics events generated by one or more vehicle-based telematics devices. The formatted measurement data is also formatted by the vehicle-based telematics device according to the reporting protocol, and was transmitted by the vehicle-based telematics devices over a wireless network component of a wide-area communications network for processing of the formatted measurement data by the vehicle telematics service.

The formatted simulation data and the formatted measurement data are both processed via a common processing pipeline of the vehicle telematics service to obtain a first set of processed data representing a processed form of the formatted simulation data and a second set of processed data representing a processed form of the formatted measurement data. The first set of processed data is transmitted by the server system to a first subscriber over the wide-area communications network, and the second set of processed data is transmitted by the server system to a second subscriber over the wide-area communications network.

The vehicle telematics simulator may reside at a client computing device or at the server system that hosts the vehicle telematics service. The vehicle telematics simulator may be used by application developers to test client-side and/or server-side application programs within the same operating environment as vehicle-based telematics devices that measure of real-world vehicle telematics events.

This summary describes only some of the concepts presented in detail by the following detailed description and associated drawings. As such, claimed subject matter is not limited by the contents of this summary.

DETAILED DESCRIPTION

Figure 1:
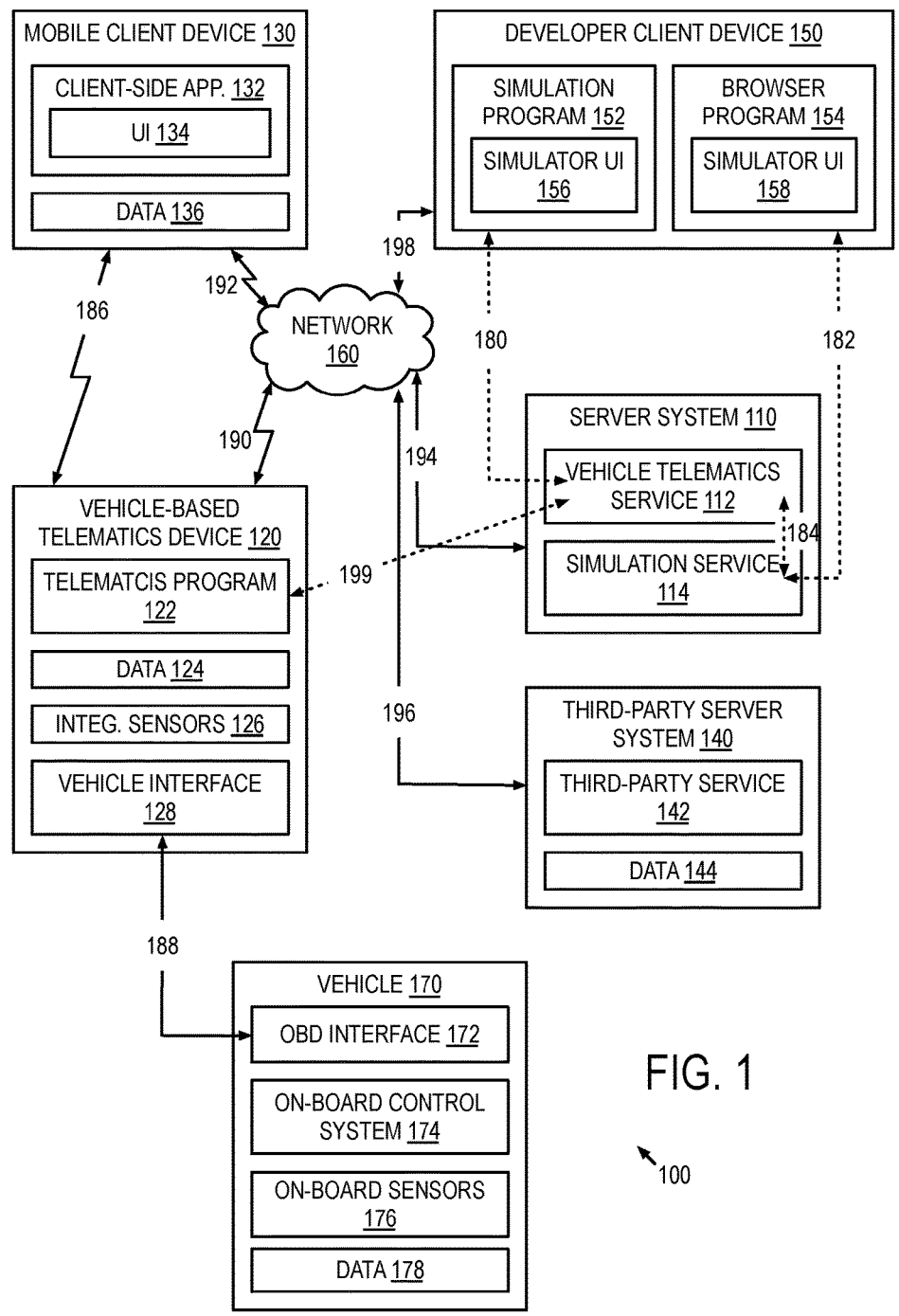
FIG. 1 is a schematic diagram depicting an example computing system.

Vehicle-based telematics devices connect vehicles with network services and subscribers of telematics data. Connected vehicles may generate a large quantity of data, such as event data, accident state data, location data, speed data, etc. Software developers can use these forms of data to create applications for connected vehicles and their subscribers. However, driving or otherwise operating a vehicle across some or all possible operating states of the vehicle to generate data for testing an application is impractical. A vehicle telematics simulator is disclosed that addresses this issue by simulating vehicle telematics data that can be used to test applications without the need for software developers to actually operate vehicles.

In accordance with the present disclosure, simulation of vehicle telematics events is provided by a vehicle telematics simulator. In an example, the vehicle telematics simulator receives user input defining a set of parameters for a simulation of one or more vehicle telematics events. A vehicle telematics event includes the existence or presence of a vehicle state (e.g., an idling state or a cruising state) or a transition between two or more vehicle states (e.g., engine starting from a non-operational state to an operational state). The vehicle telematics simulator performs the simulation of the vehicle telematics events based, at least in part, on the set of parameters defined by the user input to generate simulation data. The simulation data generated by the vehicle telematics simulator is formatted according to a reporting protocol to obtain formatted simulation data. The reporting protocol may be the same reporting protocol used by vehicle-based telematics devices to format and report measurement data representing measurements of real-world vehicle telematics events. The formatted simulation data is provided to a vehicle telematics service hosted at a server system for processing by the vehicle telematics service.

The vehicle telematics service hosted at the server system obtains the formatted simulation data, and additionally obtains formatted measurement data representing measurements of real-world vehicle telematics events generated by one or more vehicle-based telematics devices. The formatted measurement data is also formatted by the vehicle-based telematics device according to the reporting protocol, and was transmitted by the vehicle-based telematics devices over a wireless network component of a wide-area communications network for processing of the formatted measurement data by the vehicle telematics service.

The formatted simulation data and the formatted measurement data are both processed via a common processing pipeline of the vehicle telematics service to obtain a first set of processed data representing a processed form of the formatted simulation data and a second set of processed data representing a processed form of the formatted measurement data. The first set of processed data is transmitted by the server system to a first subscriber over the wide-area communications network, and the second set of processed data is transmitted by the server system to a second subscriber over the wide-area communications network.

The vehicle telematics simulator may reside at a client computing device or at the server system, including the same server system that hosts the vehicle telematics service or a third-party server system. The vehicle telematics simulator may be used by application developers to test client-side and/or server-side application programs within the same operating environment as vehicle-based telematics devices that measure of real-world vehicle telematics events.

FIG. 1 is a schematic diagram depicting an example computing system 100. Within computing system 100, a server system 110 hosts a vehicle telematics service 112 that receives reports of real-world vehicle telematics events from vehicle-based telematics devices, such as example vehicle-based telematics device 120. Vehicle telematics service 112 may serve an ecosystem of many vehicle-based telematics devices that are located on-board many different vehicles distributed across a broad geographic region. Vehicle telematics service 112 processes data reported by vehicle-based telematics devices and provides processed forms of that reported data to subscribers. As an example, mobile client device 130 may subscribe to vehicle telematics service 112 to receive data reported by vehicle-based telematics device 120. As another example, a third-party service 142 hosted at a third-party server system 140 may subscribe to vehicle telematics service 112 to receive data reported by at least some of the vehicle-based telematics devices served by vehicle telematics service 112, such as example vehicle-based telematics device 120. Third-party service 142 may in turn provide additional services to clients of the third-party server system.

In accordance with an aspect of the present disclosure, human software developers (i.e., developers) of client-side application programs (e.g., such as client-side application 132 of mobile client device 130 or telematics program 122 of telematics device 120) and/or of server-side application programs (e.g., such as third-party service 142 or vehicle telematics service 112) may test their programs using a vehicle telematics simulator that simulates telematics data. The term "simulator" as used herein refers to computer hardware implementing instructions that define a simulation program or service.

In a first implementation, an example developer client device 150 operated by a developer includes a special-purpose simulation program 152 that generates and provides simulation data to vehicle telematics service 112 for processing, as indicated by communications path 180. In this implementation, simulation program 152 may be described as a special purpose simulation program, because simulation program 152 is specifically configured or paired for use with vehicle telematics service 112. Here, simulation program 152 as executed or otherwise implemented by developer client device 150 takes the form of the vehicle telematics simulator described in further detail herein.

In a second implementation, developer client device 150 includes a general-purpose browser program 154 (or other suitable general-purpose or special-purpose program) through which the developer accesses a simulation service 114 hosted at server system 110, as indicated by communication path 182. In this implementation, simulation service 114 generates and provides simulation data to vehicle telematics service 112, as indicated by communications path 184. Here, simulation service 114 as executed or otherwise implemented by server system 110 takes the form of the vehicle telematics simulator described in further detail herein. This implementation may be referred to as a thin-client implementation by which browser program 154 is used to interact with simulation service 114 hosted at server system 110, in contrast to the rich-client implementation in which simulation program 152 residing at a client device generates and reports simulation data to vehicle telematics service 112.

In either implementation, the simulation data received via communications paths 180 or 184 may be processed by vehicle telematics service 112 using the same processing pipeline used by the vehicle telematics service 112 to process measurement data received from vehicle-based telematics devices. As such, developers are able to test their programs within the same ecosystem that includes active telematics devices reporting measurements of real-world vehicle telematics events.

Within computing system 100, computing devices may communicate with each other via a network 160. Network 160 may include a wide-area network (e.g., such as the Internet), which includes wired and/or wireless network components. Additionally or alternatively, some computing devices may communicate with each other over personal or local area network components that do not traverse network 160. As an example, mobile client device 130 may communicate with telematics device 120 via a wireless personal area network or local area network as indicated at 186. As another example, telematics device 120 may communicate with a vehicle 170 via a wired or wireless personal area network or local area network as indicated at 188.

Vehicle 170 includes an OBD interface 172 that enables telematics device 120 to communicate with one or more subsystems of the vehicle, such as on-board control system 174 and/or on-board sensors 176, as indicated at 188. As an example, vehicle 170 may provide data 178 to telematics device 120 or receive data 124 from telematics device 120 via OBD interface 172. Vehicle 170 is typically a ride-on vehicle that enables one or more passengers to be transported on-board the vehicle. Vehicle 170 may take a variety of different forms, including a land-based wheeled, rail, or track vehicle (e.g., car, truck, bus, tractor, train, locomotive, motorcycle, snowmobile, etc.), an aircraft (e.g., airplane, helicopter, etc.), a marine vessel (e.g., boat or personal watercraft), or other suitable vehicle type.

Telematics device 120 includes a vehicle interface 128 that interfaces with OBD interface 172 of vehicle 170. In wired configurations, vehicle interface 128 may include an electronic connector that mates with a corresponding electronic connector of OBD interface 172 to enable telematics device 120 to send and/or receive communications to and/or from vehicle 170 over a wired communications link. In a wireless configuration, vehicle interface 128 may include a wireless transmitter and/or receiver, or transceiver that enables telematics device 120 to send and/or receive wireless communications to and/or from a wireless receiver and/or transmitter, or transceiver of OBD interface 172. Communications between telematics device 120 and vehicle 170 indicated at 188 may be unidirectional (e.g., from the vehicle to the telematics device) or bidirectional.

Telematics device 120 further includes a telematics program 122 executed by the telematics device, data 124 stored thereon, and optionally one or more integrated sensors 126. Telematics program 122 generates measurement data (e.g., data 124) representing measurements of real-world vehicle telematics events as measured by on-board sensors 176 of vehicle 170 and/or by integrated sensors 126 (if present). Telematics program 122 provides reports of measurement data to vehicle telematics service 112, as indicated by communications path 199. In at least some implementations, a vehicle-based telematics device located on-board a vehicle may not communicate with the vehicle in any way or may have limited communications with the vehicle. In these implementations, measurement data may represent measurements of real-world vehicle telematics events as measured exclusively by integrated sensors of the telematics device.

Telematics device 120, due to its mobility, typically communicates with other computing devices of network 160 over a wireless communications link of a wireless component of network 160, as indicated at 190. In other examples, Telematics device 120 may communicate with computing devices of network 160 over a wired communications link, such as periodically via a wired dock or cable during an off-boarding operation. Similarly, mobile client devices (e.g., such as mobile client device 130), due to their mobility, typically communicate with other computing devices of network 160 over a wireless communications link of a wireless component of network 160, as indicated at 192. However, mobile client devices may also used wired communication links to communicate with computing devices of network 160. Server system 110 and third-party server system 140 communicate with other computing devices of network 160 as indicated at 194 and 196, respectively. Each of server systems 110 and 114 may include one or more server devices that are co-located or geographically distributed. Development client device 150 may take the form of a wired or wireless computing device, and may communicate with other computing devices of network 160 via a wired or wireless communications link as indicated at 198.

Within the context of computing system 100, a developer may provide user input to the vehicle telematics simulator via a user interface (UI) to define aspects of a simulation. The user input may define a set of parameters for a simulation of vehicle telematics events. As an example, simulation program 152 may include a simulator UI 156 by which the developer provides user input. Communications between simulation program 152 and vehicle telematics service 112 are indicated at 180. As another example, browser program 154 or other suitable program type, presents a simulator UI 158 that may form part of simulation service 114 hosted at server system 110. Communications between browser program 154 and simulation service 114 are indicated at 182, and communications between simulation service 114 and vehicle telematics service 112 are indicated at 184.

As previously described, processed forms of data (e.g., measurement data and/or simulation data) may be provided by vehicle telematics service 112 to subscribers, such as mobile client device 130 and/or third-party server system 140, as indicated by data 136 and data 144. Data 136 may be presented to a user of mobile client device 130 via a user interface 134 of client-side application program 132. Program 132 may take the form of a special purpose program or a general-purpose program by which a user may receive and interact with data or otherwise access services of vehicle telematics service 112 and/or third-party service 142. User interface 134 may take the form of a graphical user interface in an example. While mobile client device 130 is described in one example as being a subscriber of vehicle telematics service 112, in other examples, mobile client device 130 may be a subscriber of third-party service 142.

Figure 2:
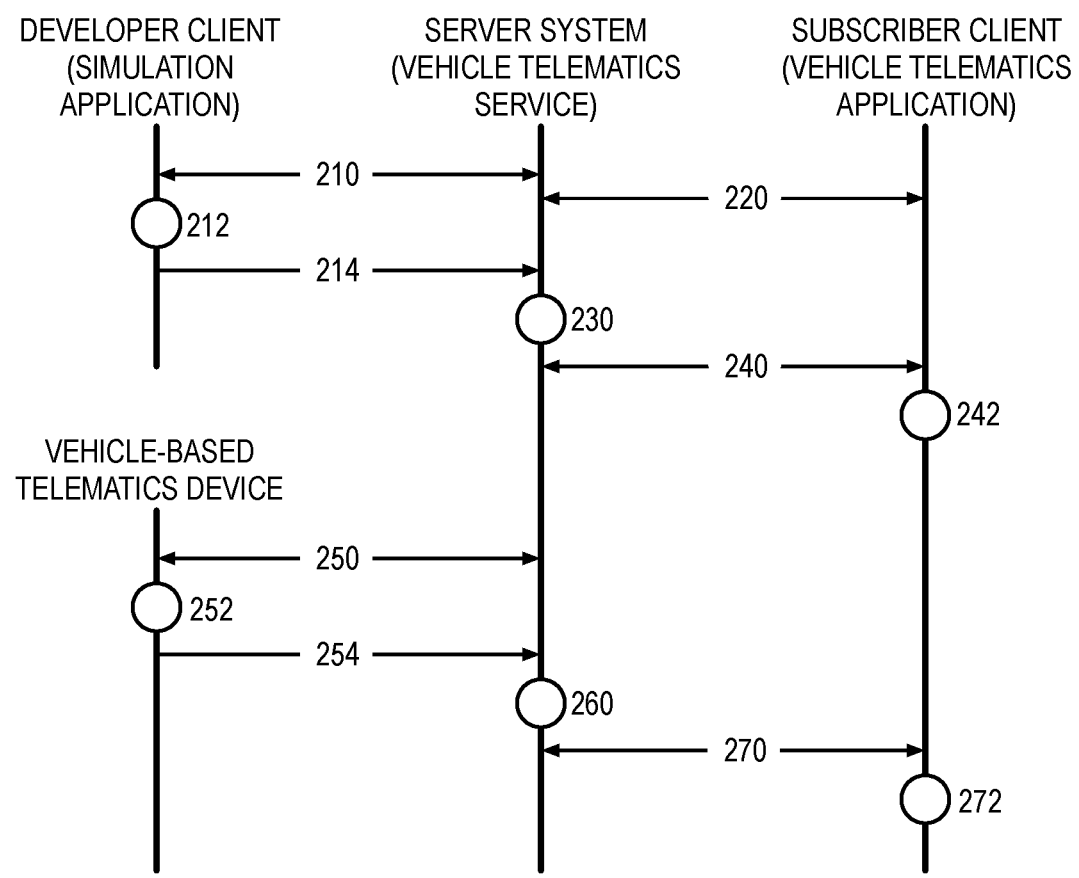
FIG. 2 is a flow diagram depicting example interactions between networked components of a computing system according to a first implementation.

FIG. 2 is a flow diagram depicting example interactions between networked components of a computing system according to a first implementation. In this first implementation, referred to as a rich-client implementation, a special-purpose simulation application residing at a client computing device generates and provides simulation data to a vehicle telematics service hosted at a server system. The simulation data may be processed at the server system by the vehicle telematics service in the same manner as measurement data obtained from vehicle-based telematics devices.

In this first implementation, a client computing device, referred to as a developer client, executes or otherwise implements a simulation application. The developer client in combination with the simulation application executed by the developer client may be referred to collectively as a simulator. The developer client of FIG. 2 is a non-limiting example of developer client device 150 of FIG. 1, and the simulation application of FIG. 2 is a non-limiting example of simulation application 152 of FIG. 1.

At 210, the simulation application and developer client (collectively as a vehicle telematics simulator) may be authenticated at the server system by the vehicle telematics service. As an example, a user (e.g., a developer) of the vehicle telematics simulator, may input authentication credentials via the simulation application that are provided to the server system for authentication by the vehicle telematics service to establish an authenticated session for the simulator. As another example, the simulator may provide a previously stored authentication credentials to the server system for authentication by the vehicle telematics service to establish an authenticated session for the simulator.

The server system obtains data from multiple or many clients in addition to the previously described vehicle telematics simulator, including vehicle-based telematics devices and other simulators. Within the vehicle telematics service and its ecosystem of clients, individual clients may be identified and distinguished from each other by client identifiers and/or authentication credentials.

At 250, an example vehicle-based telematics device may also be authenticated at the server system by the vehicle telematics service. The approach used to authenticate the telematics device may be the same as or similar to the previously described approach for authenticating the vehicle telematics simulator. In at least some examples, simulators and telematics clients, as different classes of clients, may be indistinguishable from each other by the server system and the vehicle telematics service beyond the ability to distinguish individual clients from each other. In other words, the server system and vehicle telematics service may interact with simulators in the same or similar manner as telematics clients.

At 212, the simulator generates simulation data. Generation of simulation data is described in further detail with reference to FIGS. 4-9. At 214, the simulator provides the simulation data to the vehicle telematics service. The vehicle telematics service obtains the simulation data provided by the simulator.

At 252, the vehicle-based telematics device generates measurement data. At 254, the telematics device provides the measurement data to the vehicle telematics service. The vehicle telematics service obtains the measurement data provided by the telematics client.

As depicted in FIG. 2, the vehicle telematics service obtains data from multiple sources, including simulators and telematics device. In at least some examples, simulation data may be formatted by the simulator according to a reporting protocol or other data format that is also used by telematics devices to format measurement data. Accordingly, simulation data may be indistinguishable from measurement data by the vehicle telematics service beyond the ability to distinguish individual clients from each other as sources of the data.

Figure 8:
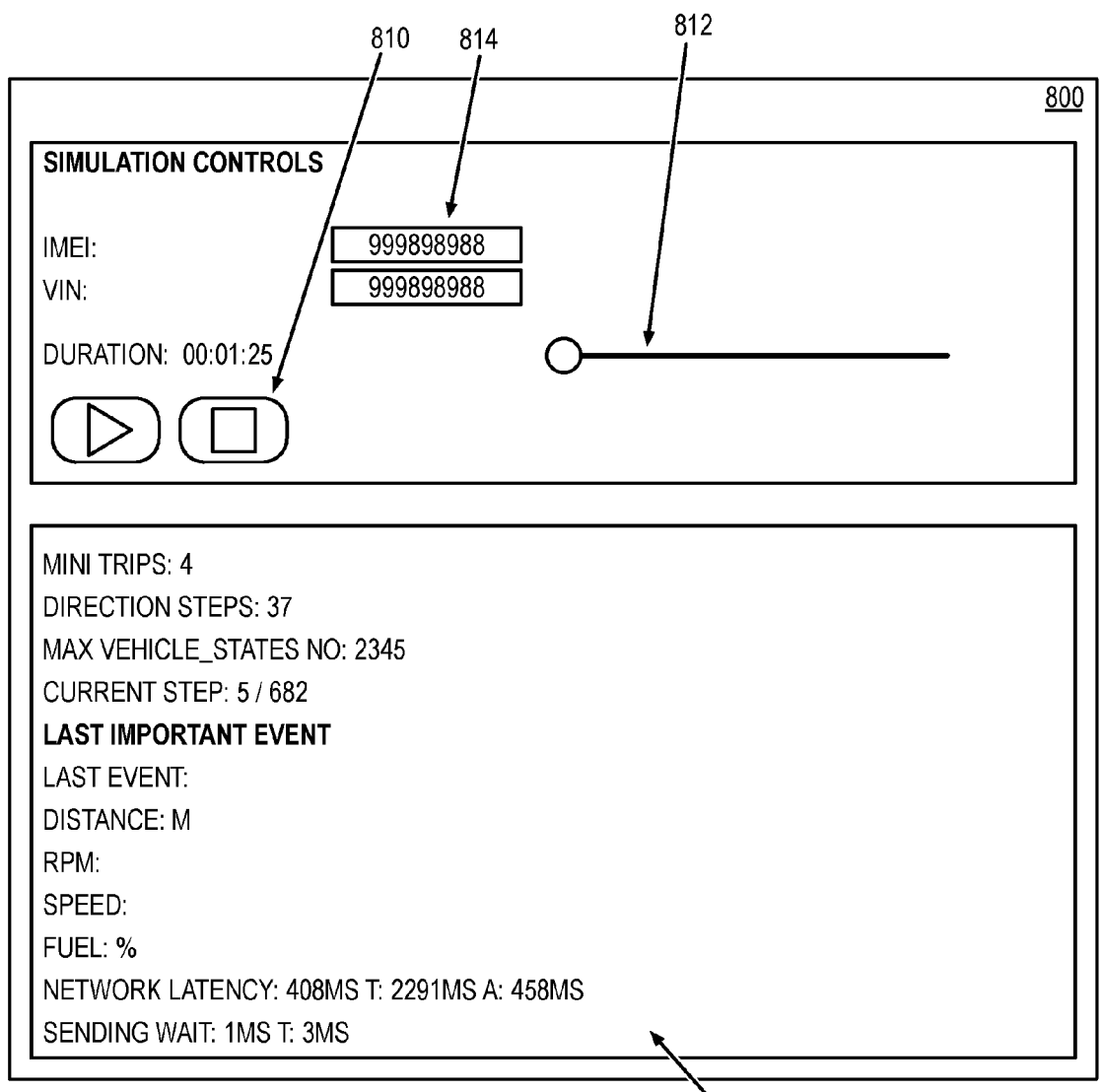

At 230, the vehicle telematics service processes the simulation data to obtain processed simulation data. Such processing may further include the vehicle telematics service storing the simulation data and/or the processed simulation data in a database system in association with an identifier of the source of the simulation data (e.g., a client identifier of the simulator). As depicted in FIG. 8, a simulator or a particular simulation may be identified by an IMEI and/or VIN, which are identifiers used to identify and distinguish vehicle-based telematics devices.

At 260, the vehicle telematics service processes the measurement data to obtain processed measurement data. Such processing may further include the vehicle telematics service storing the measurement data and/or the processed measurement data in a database system in association with an identifier of the source of the measurement data (e.g., a client identifier of the telematics client such as an IMEI and/or VIN).

In at least some examples, the vehicle telematics service may process the simulation data and the measurement data using the same processing pipeline. For example, the vehicle telematics service may utilize the same instantiated processes for receiving messages containing simulation data or measurement data, reading that data, storing that data, modifying or combining aspects of that data, filtering that data, and forwarding that data onward to other computing devices.

Meanwhile, a client computing device, referred to as a subscriber client, executes a vehicle telematics application with which the subscriber client interacts with the vehicle telematics service to access data reported to the vehicle telematics service by simulators and/or telematics clients. At 220, the subscriber client may be authenticated at the server system by the vehicle telematics service using any of the previously described techniques for authenticating simulators and/or telematics clients. While the subscriber client is depicted as being independent of the developer client in FIG. 2, these clients may be the same client device in which the client device executes a simulation application and a vehicle telematics application. Furthermore, the vehicle telematics application may be integrated with the simulation application in some examples to provide a combined developer application executable at or by a common client device.

The vehicle telematics service is typically able to distinguish subscriber clients as consumers of data from simulators and telematics clients that are the sources of that data. Here, the vehicle telematics service may support multiple client account types, including data provider accounts for simulators and telematics clients, developer accounts for developer clients, and data subscriber accounts for subscriber clients. In at least some examples, the vehicle telematics service may further support different client account types for simulators and telematics clients to enable these data sources to be distinguished from each other with respect to simulation data versus measurement data. For example, simulators may be organized under a developer account type, whereas telematics clients may be organized under a telematics account type.

At 240, the processed simulation data is provided to the subscriber client. Processed simulation data may be provided to the subscriber client using a request-based model or a push-based model, depending on implementation. As an example, the server system may transmit processed simulation data over a wide area network directed to the subscriber client responsive to receiving a request from the subscriber client or responsive to receiving and processing new simulation data. At 242, the subscriber client uses the processed simulation data at an application or service. As an example, the subscriber client presents the processed simulation data via a graphical display. As another example, the subscriber client may take the form of a third-party service that forwards the processed simulation data to one or more other clients subscribing to the third-party service.

At 270, the processed measurement data is provided to the subscriber client. Processed measurement data may be provided to the subscriber client using a request-based model or a push-based model, depending on implementation. In at least some examples, the model used for simulation data may be the same model used for measurement data. At 272, the subscriber client uses the processed measurement data at an application or service. As an example, the subscriber client presents the processed measurement data via a graphical display. As another example, the subscriber client may take the form of a third-party service that forwards the processed measurement data to one or more other clients subscribing to the third-party service.

Figure 3:
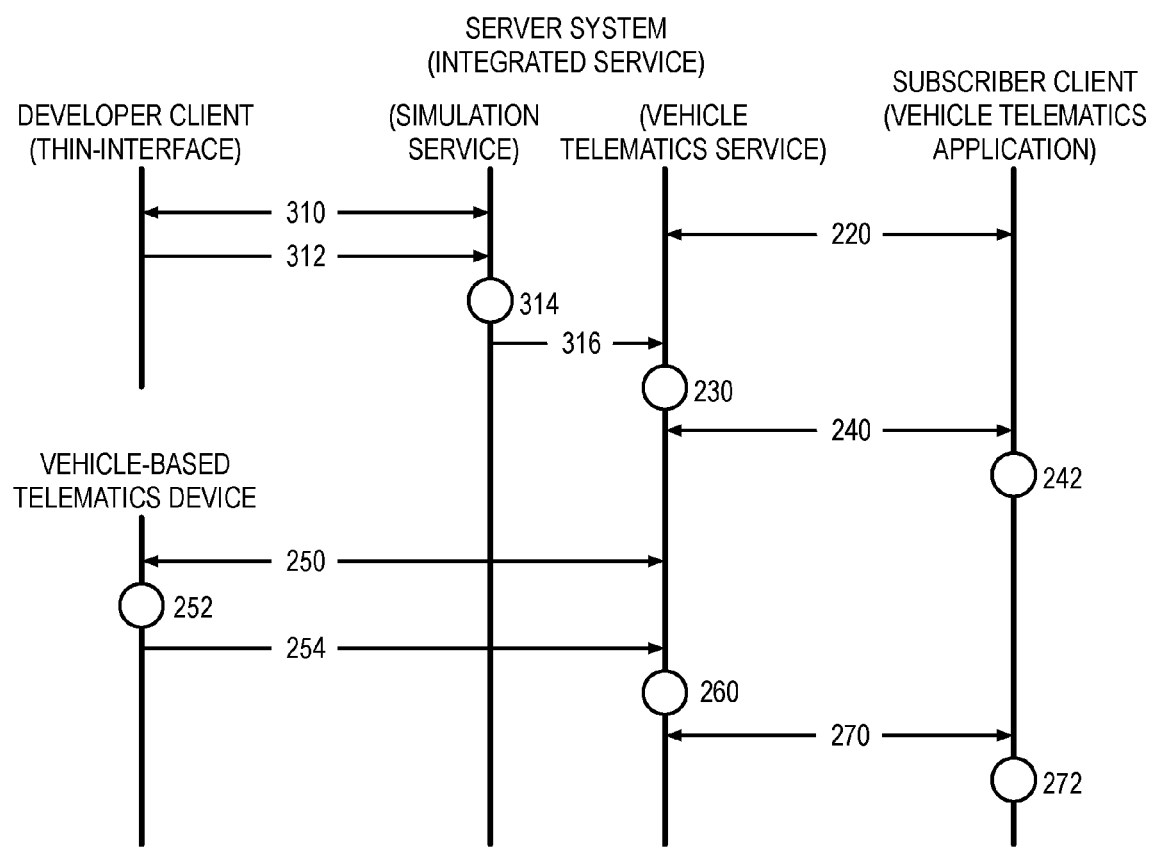
FIG. 3 is a flow diagram depicting example interactions between networked components of a computing system according to a second implementation.

FIG. 3 is a flow diagram depicting example interactions between networked components of a computing system according to a second implementation. In this second implementation, referred to as a thin-client implementation, a simulation service hosted at a server system generates simulation data in accordance with definitions provided by a client computing device via a thin-interface. The simulation service generates and provides the simulation data to the vehicle telematics service, which in turn processes the simulation data in the same manner as measurement data obtained from vehicle-based telematics devices.

In this second implementation, a client computing device, referred to as a developer client, executes a general-purpose or special-purpose application that enables a developer to access a simulation service hosted at a server system. The server system in combination with the simulation service executed or otherwise implemented by the server system may be referred to collectively as a simulator. The developer client of FIG. 3 is a non-limiting example of developer client device 150 of FIG. 1, and the simulation service of FIG. 3 is a non-limiting example of simulation service 114 of FIG. 1 hosted at server system 110.

The flow diagram of FIG. 3 is similar to the flow diagram of FIG. 2 in many aspects. However, in FIG. 3, the developer client is authenticated at 310 at the simulation service hosted at the server system, and user input provided by the user via the thin-interface is provided to the simulation service over a communications network (e.g., a wide area communications network) as indicated at 312. The simulation service obtains the user input and generates the simulation data based on the user input at 314. The simulation service provides the simulation data to the vehicle telematics service hosted at the server system, which processes the simulation data as previously described with reference to FIG. 2. By contrast, the vehicle-based telematics client provides the measurement data to the vehicle telematics service rather than the simulation service.

Figure 4:
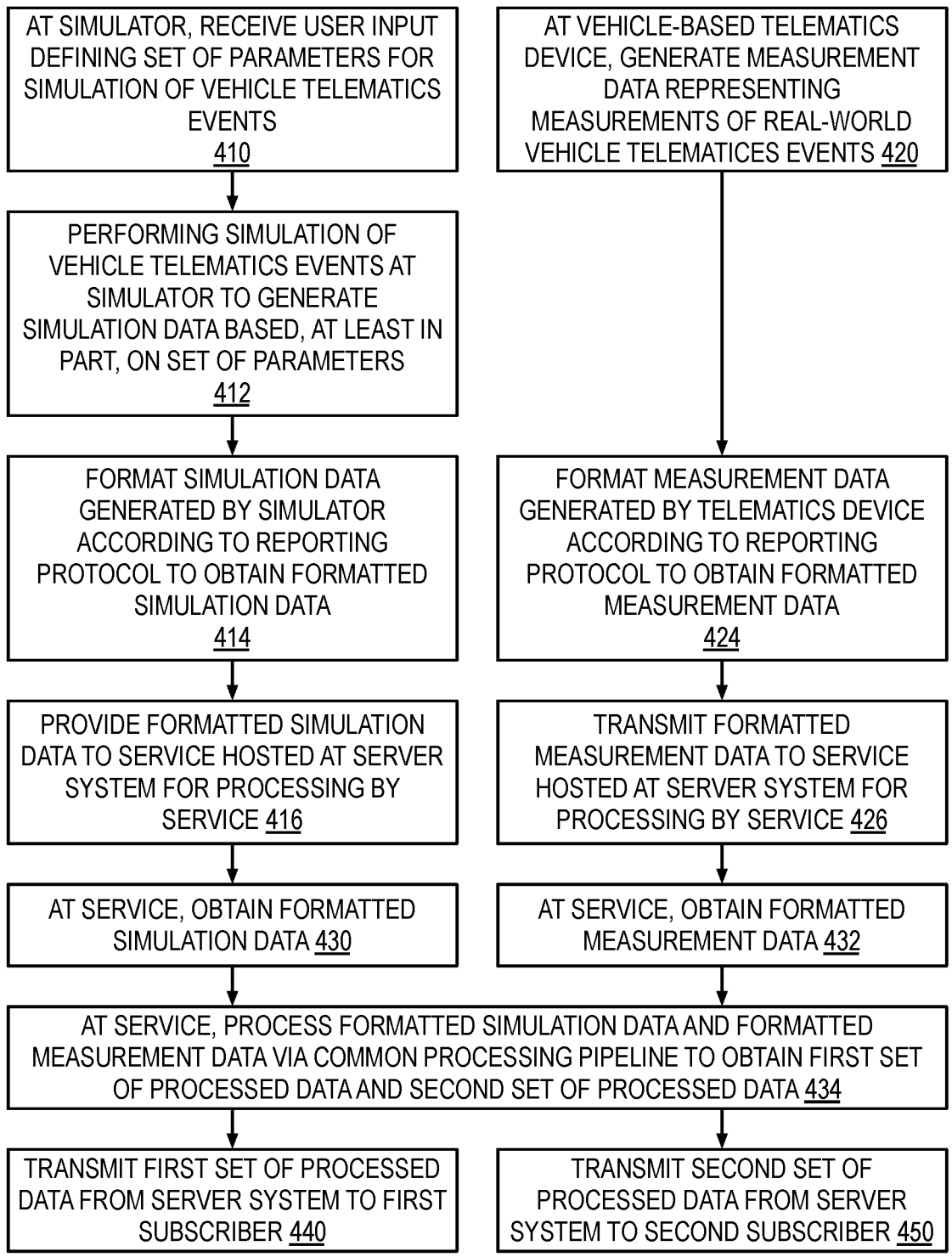
FIGS. 4 and 5 are flow diagrams depicting example methods.

FIG. 4 is a flow diagram depicting an example method 400. In an example, method 400 may take the form of a computer-implemented method that is performed by a computing system of one or more computing devices. Example computing systems are described with reference to FIGS. 1 and 10.

At 410, method 400 includes, at a vehicle telematics simulator, receiving user input defining a set of parameters for a simulation of vehicle telematics events. At 412, method 400 includes, at the vehicle telematics simulator, performing the simulation of vehicle telematics events to generate simulation data based, at least in part, on the set of parameters. At 414, method 400 includes, at the vehicle telematics simulator, formatting the simulation data generated by the vehicle telematics simulator according to a reporting protocol to obtain formatted simulation data. At 416, method 400 includes, at the vehicle telematics simulator, providing the formatted simulation data to a vehicle telematics service hosted at a server system for processing by the vehicle telematics service. The method may further include providing the formatted simulation data to the vehicle telematics service by associating an identifier with the formatted simulation data in which the identifier is further associated with the first subscriber in a database system of the vehicle telematics service.

For implementations where the vehicle telematics simulator resides at a client computing device, the method at 410 includes receiving the user input defining the set of parameters via a graphical user interface of a vehicle telematics simulator program executed by the client computing device to instantiate the vehicle telematics simulator. Also in these implementation, method at 416 includes providing the formatted simulation data to the vehicle telematics service hosted at the server system by transmitting, at the client computing device, the formatted simulation data over the wide-area communications network directed to the vehicle telematics service hosted at the server system. In these implementations, the method may further include storing the set of parameters defined by the user input at a storage subsystem of the client device accessible to the vehicle telematics simulation, and storing the simulation data and/or the formatted simulation data at the storage subsystem of the client device accessible to the vehicle telematics simulator.

For implementations where the vehicle telematics simulator is hosted at the server system, the method includes receiving the user input defining the set of parameters at the server system over the wide-area communications network via a graphical user interface of a client computing device. In these implementations, providing the formatted simulation data to the vehicle telematics service hosted at the server system may include the vehicle telematics simulator storing the formatted simulation data in a database system of the server system accessible to the vehicle telematics service.

At 420, method 400 includes, at a vehicle-based telematics device, generating measurement data representing measurements of real-world vehicle telematics events. At 424, method 400 includes, at the vehicle-based telematics device, formatting the measurement data generated by the vehicle-based telematics device according to a reporting protocol to obtain formatted measurement data. At 426, method 400 includes, at the vehicle-based telematics device, transmitting formatted measurement data to the vehicle telematics service hosted at the server system for processing by the vehicle telematics service. As an example, the formatted measurement data may be transmitted by the vehicle-based telematics device over a wireless network component of a wide-area communications network for processing of the formatted measurement data by the vehicle telematics service.

At 430, method 400 includes, obtaining the formatted simulation data provided by the vehicle telematics simulator at the vehicle telematics service. At 432, method 400 includes, obtaining the formatted simulation data transmitted by the vehicle-based telematics device at the vehicle telematics service. At 434, method 400 includes, at the vehicle telematics service, processing the formatted simulation data and the formatted measurement data via a common processing pipeline of the vehicle telematics service to obtain a first set of processed data representing a processed form of the formatted simulation data and a second set of processed data representing a processed form of the formatted measurement data.

At 440, method 400 includes, transmitting the first set of processed data from the server system to a first subscriber over the wide-area communications network. At 450, method 400 includes, transmitting the second set of processed data from the server system to a second subscriber over the wide-area communications network.

Figure 5:
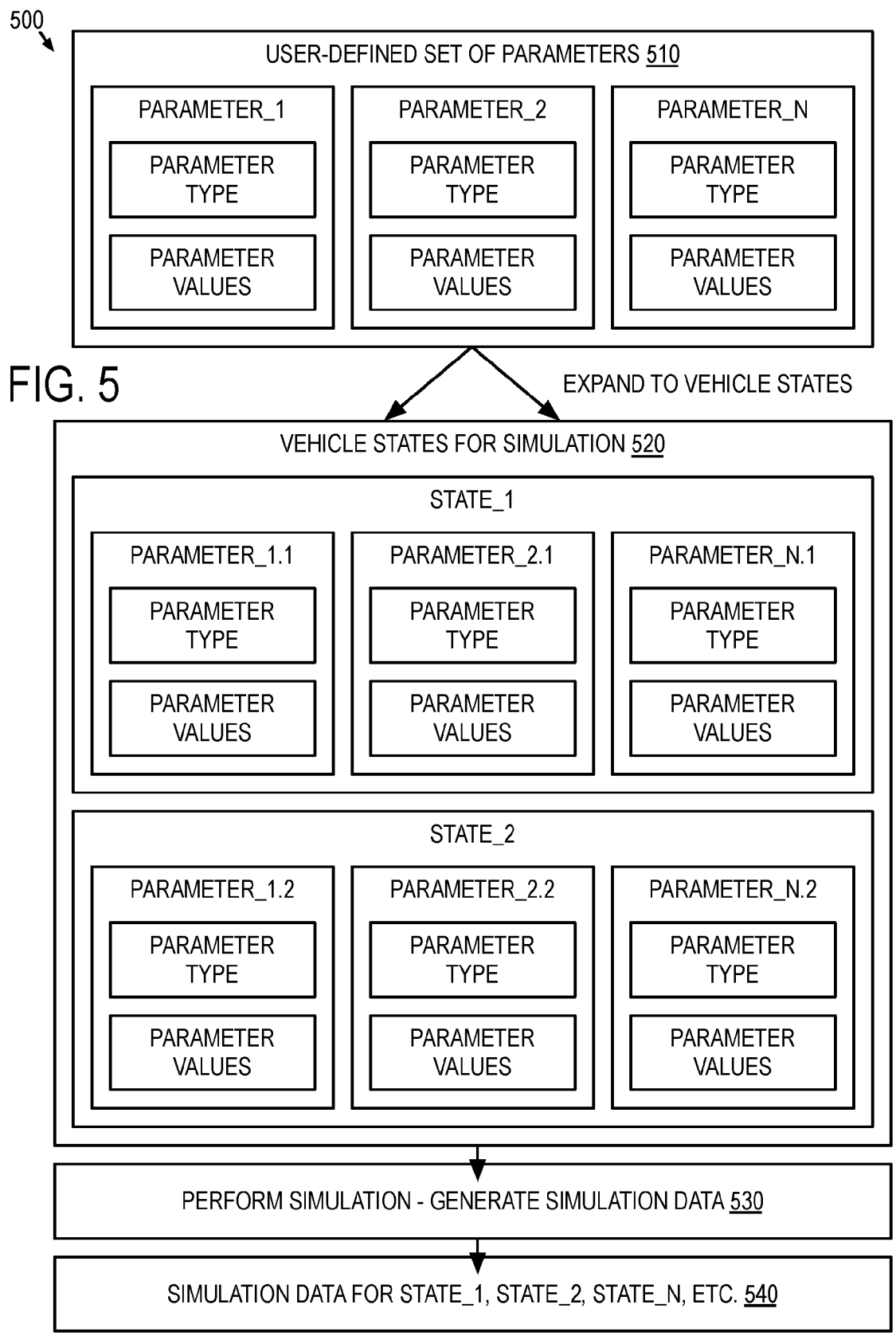

FIG. 5 is a flow diagram depicting an example method 500. In an example, method 500 may take the form of a computer-implemented method that is performed by a computing system of one or more computing devices. Example computing systems are described with reference to FIGS. 1 and 10.

A user-defined set of parameters 510 is received by the vehicle telematics simulator. User-defined set of parameters 510 is a non-limiting example of a set of parameters defined by user input received at 410 in FIG. 4. A user-defined set of parameters may include one or more parameters. As an example, user-defined set of parameters 510 includes a plurality of parameters represented in FIG. 5 as PARAMETER_1, PARAMETER_2, PARAMETER_N. Each parameter may include or may otherwise be defined by a parameter type and a set of parameter values for that parameter type.

A parameter type may include an intrinsic parameter type that is intrinsic to a vehicle and/or a vehicle-based telematics device, or an extrinsic parameter type that is extrinsic to the vehicle and/or the vehicle-based telematics device. Examples of intrinsic parameter types include vehicle speed, vehicle acceleration/deceleration, engine RPM, fuel level, fuel efficiency, battery charge level, battery connection state, odometer reading, vehicle heading, vehicle position (e.g., longitude, latitude, altitude), ignition state, transmission state, etc. Examples of extrinsic parameter values include travel routes for the vehicle, environmental conditions (e.g., temperature, pressure, road conditions, etc.), state of a simulated vehicle-based telematics device, objects that interact with the vehicle, pre-defined or random events that effect the vehicle, a duration of the simulation, etc. Additional examples of parameters are described with reference to FIGS. 6-9.

A set of parameter values for each parameter may include one or more values. A set of parameter values may define a range of values in at least some examples. As an example, PARAMETER_1 may include a vehicle speed parameter type with a set of parameter values corresponding to a range of vehicles speeds between a first value (e.g., 30 miles per hour) and a second value (e.g., 90 miles per hour). This set of parameter values for the vehicle speed parameter type may be defined by a user via a user interface, for example, as depicted in FIG. 5. As another example, a parameter may include a single parameter value. FIG. 5 depicts a parameter type "EVENTS" as having a single parameter value "30%". This user-defined set of parameters may take the form of inputs into the simulator for simulating one or more vehicle telematics events.

Referring again to FIG. 5, user-defined set of parameters 510 may be expanded by the simulator to a set of vehicle states 520. A set of vehicle states may include one or more vehicle states, with each vehicle state including one or more parameters. Typically, a set of vehicle states includes many vehicle states generated by the simulator from an initial set of user-defined parameters. For example, the simulator may generate vehicle states for each combination of parameter types and their parameter values with vehicle states representing increments of parameter values within a value range. In this example, the set of vehicle states includes example vehicle states indicated as STATE_1 and STATE_2. The previously describes parameters of the user-defined set of parameters are included in each vehicle state, but may have different parameter values relative to each other. STATE_1 includes PARAMETER_1.1 whereas STATE_2 includes PARAMETER_1.2. Here, these parameters differ from each other with respect to their parameter values but not necessarily with respect to their parameter types. For example, the user-defined set of parameters may include the previously described vehicle speed parameter type with parameter values having a range of 30-90 miles per hour for PARAMETER_1. Continuing with this example, PARAMETER_1.1 may include the vehicle speed parameter type with a parameter value of 30 miles per hour, and PARAMETER_1.2 may include the vehicle speed parameter type with a parameter value of 90 miles per hour. Still other vehicle states may include intermediate parameter values for the vehicle speed parameter type, such as at evenly distributed intervals (e.g., every 1 mile per hour, every 10 miles per hour, etc.).

Additionally or alternatively, one or more parameters of the user-defined set of parameters may be omitted from at least some of the vehicle states. As an example, randomized or predefined events may be introduced into the simulation for only a subset of the vehicle states. Additionally or alternatively, one or more additional parameters not present within the user-defined set of parameters may be included in some or all of the vehicle states. For example, a user may be presented with the option of defining only a subset of the total set of parameters used by the simulator to generate simulation data. Here, the user may be presented with the option to define only a small fraction of all parameters. However, in other examples, the user may be able to define all parameters that are available to the simulator.

At 530, the simulator performs, executes, or otherwise runs the simulation and generates simulation data based on the vehicle states for the simulation. As an example, the simulator may perform a simulation for each vehicle state of the set of vehicle states, including any transitions between vehicle states that are to be simulated. The simulation data may take the form of an array of data items in which each vehicle state has one or more data items having corresponding data values associated with that vehicle state. The data values for a vehicle state may include the identifiers of the parameter types and the parameter values included within that vehicle state, and may additionally include data values that are generated (e.g., calculated) based on the parameters of that vehicle state. In at least some implementations, the simulator may utilize one or more pre-defined functions or mathematical relationships between input values and output values of the simulation. Such functions or mathematical relationships may be based on prior training of the simulator on real-world data obtained from real-world measurements received from vehicle-based telematics devices. As an example, the simulator may reference a function that describes a pre-defined relationship between vehicle speed and the transmission gear that is engaged in the simulated vehicle. At least some aspects of the simulation data may include randomized data that is based on a randomized input into the simulation, such as may be generated by a random number generator of the simulator. As an example, data values may be randomized within a pre-defined or user-defined range of values.

Typically, the simulator outputs a particular set of simulation data values for a given vehicle state or transition between vehicle states that is simulated. As an example, an engine ignition event may be simulated by the simulator outputting a specific set of telematics data, which is related to that event. Here, the engine ignition event may refer to transition from an engine-off state in which the engine has zero RPM and zero fuel consumption rate to an engine-on state in which the engine has a greater than zero RPM and a greater than zero fuel consumption rate. In this context, the simulator may, for example, output data values associated with the engine ignition event.

At 540, the simulation data for each vehicle state is output by the simulator. The simulation data may be provided to a vehicle telematics service as previously described with reference to FIGS. 1-4.

FIGS. 6-9 depict example graphical user interfaces (GUIs) for controlling aspects of a simulation. As an example, user input provided by a user via one or more of the GUIs of FIGS. 6-9 is received and used by the simulator to define aspects of a simulation and to generate simulation data for that simulation. The GUIs of FIGS. 6-9 include a variety of tools that enable a user to view, modify, and save information defining aspects of a simulation. It will be understood that these GUIs, their tools, and their format are non-limiting examples of interfaces of a simulator, and that other suitable GUI configurations may be used. Furthermore, in other implementations, these GUIs may instead take the form of coding interfaces in which information defining aspects of a simulation are manually coded into programming code defining the simulation and/or the simulation program or service.

The GUIs of FIGS. 6-9 enable a user to control a vehicle telematics simulator to: (1) simulate an individual state of a vehicle, (2) simulate multiple states of a vehicle, (3) simulate a predefined route (i.e., a trip) for a vehicle, (4) simulate a random route for a vehicle, (5) control aspects of the parameters and simulated data for each state of the vehicle along the router, (6) simulate a fleet of multiple vehicles with the vehicles being simulated as operating in parallel, in a sequence, or continuously, and (7) control simulation of routes using play, pause, stop, and delay features.

The vehicle telematics simulator may utilize a plurality of data parameters as inputs that define aspects of a simulation. As a non-limiting example, data parameters for a simulation may include: (1) geographic locations representing a start point, an end point, and optionally zero, one, or more waypoints for a vehicle to be simulated, (2) a speed range for the vehicle, (3) an engine or motor RPM range for the vehicle, (4) a fuel level range for the vehicle, (5) a fuel efficiency range for the vehicle, (6) a battery level range for the vehicle, (7) a quantity of vehicle states to be generated for the vehicle, (8) an identifier of a simulated vehicle-based telematics device to be located on-board the vehicle, (9) an identifier of the vehicle to be simulated.

Figure 6:
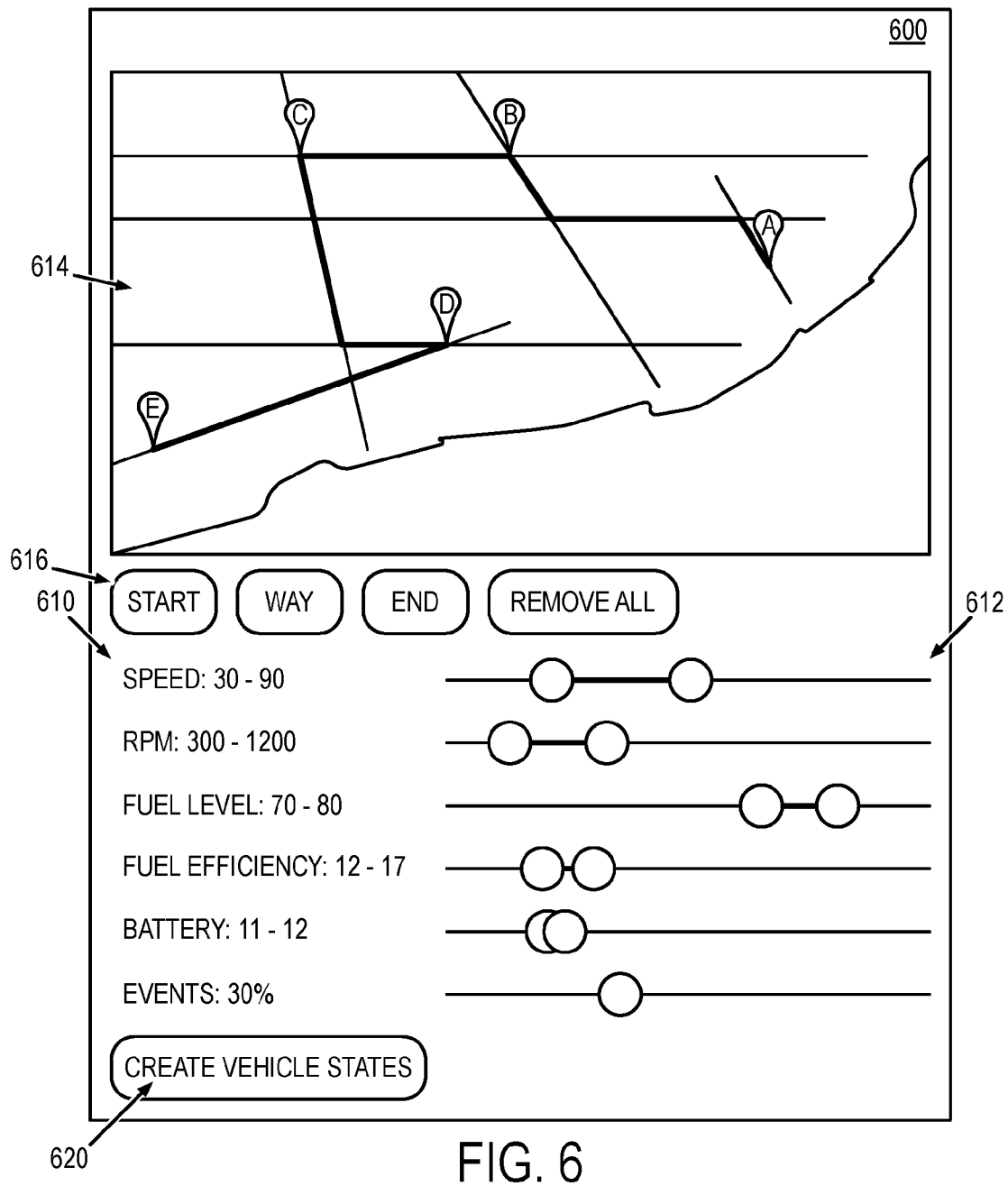
FIGS. 6-9 depict example graphical user interfaces for controlling aspects of a simulation.

GUI 600 of FIG. 6 includes a variety of tools that enable a user to define a set of parameters for simulating vehicle telematics events. As previously described with reference to method 500 of FIG. 5, before generating states for a vehicle, the user may specify ranges for some or all of the parameters. For example, GUI 600 provides a visual indication at 610 of a plurality of parameter types and parameter values for each parameter type that may be changed by the user via selectors 612. GUI 600 includes example parameter types such as vehicle speed or vehicle speed range, an engine or motor RPM or RPM range, a fuel level or fuel level range, a fuel efficiency or fuel efficiency range, a battery charge level or battery charge level range, an events parameter type (representing a quantity of vehicle states to be generated for the simulation), and travel route parameter type as part of map tool 614. In this example, selectors 612 take the form of sliders that enable the user to define an individual value or a range of values for each parameter type. GUI 600 further includes a map tool 614 that enables a user to define a route traveled by a vehicle within a simulation.

In at least some examples, map tool 614 may form part of a third-party mapping service (e.g., the GOOGLE MAPS brand of mapping service) that enables a user to visually define geographic locations or points on a map, which in-turn generates geographic location values for those geographic location or points. Selectors 616 enable a user to select a start point, waypoints, and an end point for the route presented by map tool 614. Markers labeled A-E in FIG. 6 may be moveable by the user within the map tool to change the route. Once the user has defined a set of parameters for the simulation, the user may use selector 620 to instruct the simulator to generate vehicle states based on the user-defined set of parameters.

As non-limiting examples, geographic locations may be defined (e.g., via the map tool) by geographic location values (e.g., latitude and longitude) for a start point of the vehicle, an end point of the vehicle, and optionally a plurality of waypoints through which the vehicle passes between the start point and the end point (e.g., up to eight or more waypoints); a vehicle speed range may be defined by a minimum vehicle speed and a maximum vehicle speed (e.g., within a range of between zero to two hundred kilometers per hour, or other suitable bounds); an engine or motor RPM range may be defined by a minimum RPM and a maximum RPM (e.g., within a range of zero to ten thousand RPM, or other suitable bounds); a fuel level range may be defined by a start fuel level and an end fuel level (e.g., within a range of 0% and 100%, or other suitable bounds, which may be used to simulate fuel consumption and refueling events in combination with fuel efficiency for the vehicle); a fuel efficiency range may be defined by minimum and maximum values (e.g., between zero and one hundred, which may represent an abstracted range of fuel efficiency); a batter level range may be defined by minimum and maximum values (e.g., between 0 to 20 volts, or other suitable bounds); a quantity of vehicle states (represented in FIG. 6 by the Events tool) may be defined by a value between minimum and values (e.g. between 1% and 100%).

Figure 7:
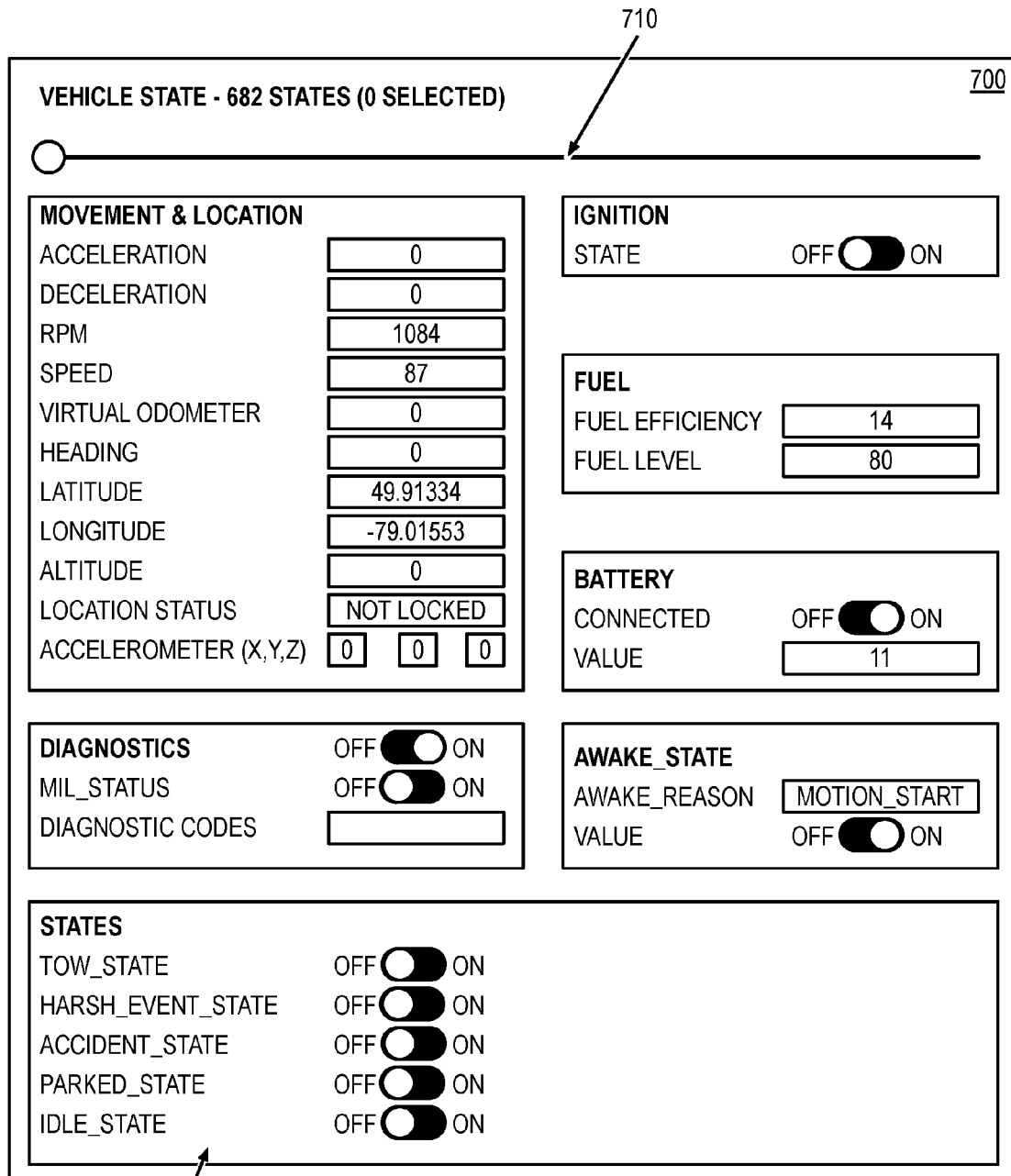

As previously described with reference to method 500 of FIG. 5, the simulator generates vehicle states based on parameters defined by the user. GUI 700 of FIG. 7 depicts an example set of vehicle states that were generated by the simulator based on the user-defined parameters provided via GUI 600. GUI 700 includes a navigation tool 710 that enables a user to navigate among the various vehicle states generated by the simulator. In this example, the simulator has generated 682 states as presented via GUI 700. The quantity of vehicle states generated in this example may be based on the value defined using the Events tool in FIG. 5. For example, by increasing the value defined by the Events tool (e.g., from 30% to 40%), the simulator may increase the quantity of vehicle states that are generated, and by reducing the value defined by the Events tool, the simulator may reduce the quantity of vehicle states that are generated. For each vehicle state, various simulation parameters 712 are presented via GUI 700. As an example, the various simulation parameters are organized into categories, including Movement & Location, Diagnostics, States (i.e., Primary States), Ignition, Fuel, Battery, Awake_State. GUI 700 enables the user to set or otherwise control parameters for each state. Each of the various simulation parameters for each vehicle state may be further modified by the user using associated selectors, form fields, or other suitable tools. A user may modify one or more parameters as desired on a state-by-state basis from the simulation parameters generated by the simulator.

For each vehicle state, inputs to the simulation that may be generated by the simulator include: (1) Movement & Location, including: Acceleration, Deceleration, RPM, Speed, VirtualOdometer, Heading, Latitude, Longitude, Altitude, GPS Location Status, Accelerometer (X,Y,Z), (2) Diagnostics, including: MilStatus (True/False), Diagnostic-Codes (comma separated list of codes), (3) Ignition State, (4) Fuel, including: FuelEfficiency, FuelLevel, (5) Battery, including: Connected (True/False), Value, (6) Awake_State, including: AwakeReason, Value (True/False), (7) Primary States, including: TowState (True/False), AccidentState (True/False), IdleState (True/False), HarshEventState (True/False), ParkedState (True/False).

During a simulation, the user can control or otherwise define a trip duration, and play, pause, or stop the simulation, and view statistics related to the trip. GUI 800 of FIG. 8 includes simulation controls in the form of play/pause and stop selectors indicated at 810 for playing, pausing, and stopping a simulation. GUI 800 further includes a trip duration tool in the form of a slider that enables a user to control or otherwise define the duration of the trip associated with the simulation. Simulation controls of GUI 800 further include fields at 814 that enables a user to define or view the IMEI (International Mobile Station Equipment Identity) of a simulated vehicle-based telematics device and a VIN (Vehicle Identification Number) of a simulated vehicle for which the simulation is performed. Additional information relating to the simulation is presented to the user via GUI 800 as indicated at 816. The various information indicated at 816 may be updated in real-time during a simulation to reflect current simulation data.

Figure 9:
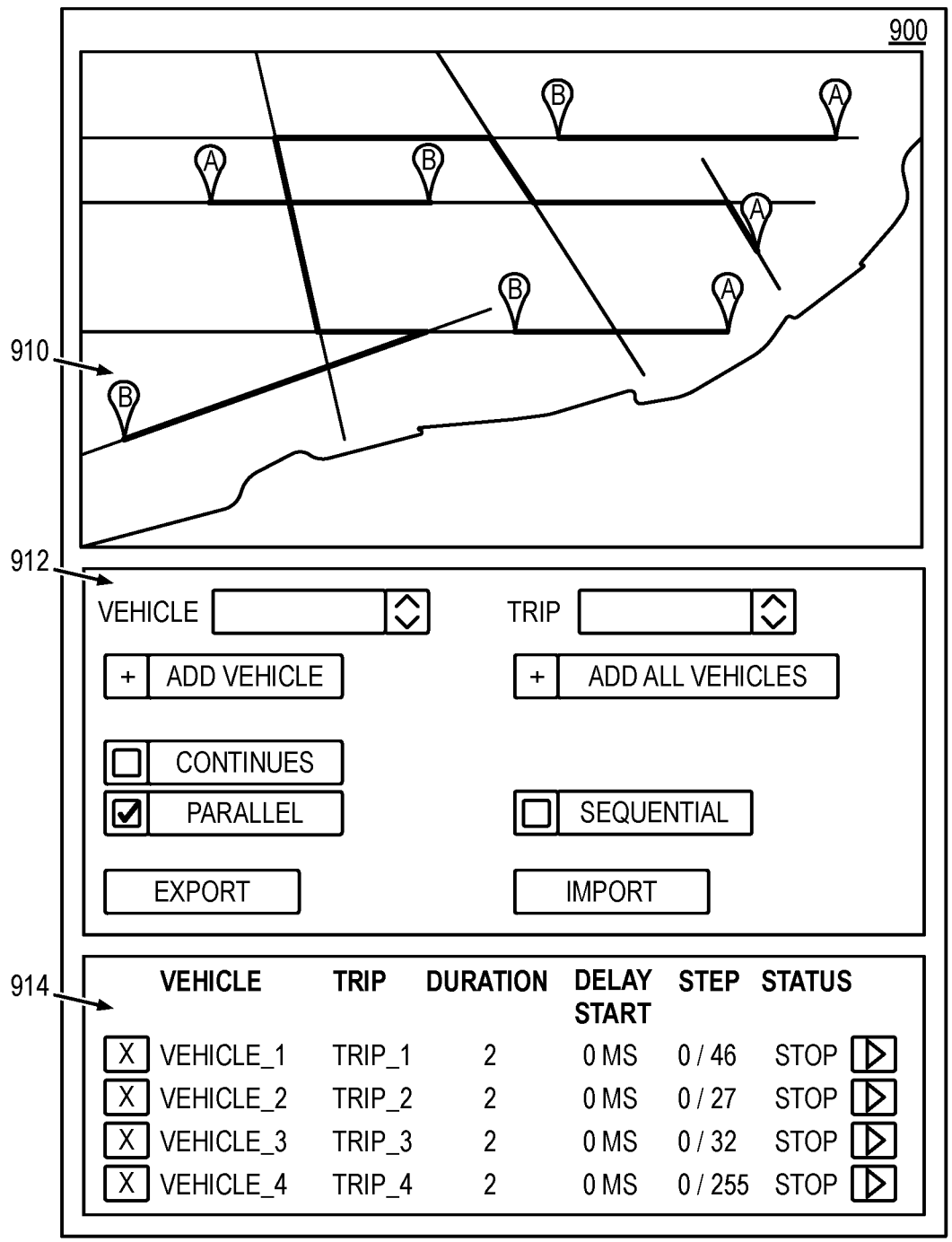

GUI 900 of FIG. 9 depicts an example of tools that may be provided to enable a user to simulate a fleet of vehicles involving multiple trips for multiple vehicles of the fleet. GUI 900 includes a map tool 910 that enables a user to define one or more different routes. In this example, a user has defined four routes identified as TRIP_1 through TRIP_4 in GUI 900. In FIG. 9, each route begins at reference letter A and ends at reference letter B. GUI 900 includes a vehicle creation tool 912 that enables a user to define different vehicles having different parameters associated with each vehicle, such as previously described with reference to GUIs 700 and 800. Vehicle creation tool 912 enables vehicles to be simulated in in parallel or sequentially within a vehicle queue depicted in summary region 914 of GUI 900. Within summary region 914, a user has created four different vehicles identified as VEHICLE_1 through VEHICLE_4 in which each vehicle is associated with a different route.

Additionally, each vehicle may be independently associated with a different duration, delayed start value, quantity of states (as indicated by a step counter among a total quantity of states for each vehicle), and simulation status information for each vehicle. Vehicle creation tool 912 additionally enables a user to associated routes with vehicles, export data, import data, and operate a simulation in a continuous mode.

The following is a non-limiting example of simulation data that may be output by the simulator. Each data item in this example may include a parameter identifier (e.g., Speed), one or more values for that data item (e.g., a magnitude), a unit type identifier (i.e., "units", such as e.g., meters per second) for the one or more values, and an associated time stamp for that data item or its values. For some data items, its value or values may take the form of other data items.

In this example, data items may be organized into three collections of data: (1) ReportRequest, (2) TcuVehicle (referring to the data reported to the vehicle-based telematics device via the OBD interface of the vehicle), and (3) TcuDevice (referring to the data originating at or from the vehicle-based telematics device). ReportRequest may refer to a collection of data that accompanies each reporting of simulation data. As a non-limiting example, ReportRequest may include the following data items: (1) IMEI (e.g., as a string), (2) EventType (string, optional), (3) Vehicle (TcuVehicle), (4) TelematicDevice (TcuDevice, optional), (5) DeviceTime (string, optional). The information in parenthesis following each data item includes the type of data (e.g., string, Boolean, or another data item) and an indication of whether that data item is optional. Reference to "optional" data items in this or other examples described herein should not interpreted as requiring data items denoted as non-optional in all examples or instances, since the examples are provided for illustrative purposes.

As a non-limiting example, TcuVehicle may include the following data items: VinDetails (IVinDetails, optional), MessageId (string, optional), IsLastMessage (boolean, optional), VIN (string, optional), id (string, optional), MilStatus (boolean, optional), IMEI (string, optional), DeviceTime (string, optional), LastContactTime (string, optional), Acceleration (Acceleration, optional), Deceleration (Acceleration, optional), RPM (Rpm, optional), IgnitionState (IgnitionState, optional), Speed (Speed, optional), FuelEfficiency (FuelEfficiency, optional), FuelLevel (FuelLevel, optional), VirtualFuelConsumption (FuelVolume, optional), Battery (Battery, optional), Location (Location, optional), Accelerometer (Accelerometer, optional), Heading (Heading, optional), Odometer (Odometer, optional), VirtualOdometer (Odometer, optional), DiagnosticCodes (Array [DiagnosticCode], optional), Trip (TcuTrip, optional), FaultedTrip (TcuTrip, optional), FuelType (string, optional)=['Query', 'Gasoline', 'Diesel', 'Electric'], FuelEfficiencyCalculationMethod (string, optional)=['Query', 'EngineFuelRate', 'MassAirFlow', 'Calculated', 'None'], EFRScalingCoefficient (number, optional), MAVScalingCoefficient (number, optional), Thresholds (VehicleThresholds, optional), EventCode (string, optional), SequenceNumber (integer, optional), Source (string, optional), IngressAuditLog (Array [string], optional), Revision (integer, optional), IsFirstMessage (boolean, optional), GatewayTimeStamp (string, optional), IngressStartTimeStamp (string, optional), IngressCompleteTimeStamp (string, optional), TowState (TowState, optional), AccidentState (AccidentState, optional), IdleState (IdleState, optional), HarshEventState (HarshEventState, optional), ParkedState (ParkedState, optional), GPSSpeed (Speed, optional), MessageGroupId (string, optional), OBDIndicators (OBDIndicators, optional), OBDMonitors (OBDMonitors, optional), OBDPidSupport (OBDPidSupport, optional), SkipTripGear (boolean, optional), SkippedTripGear (boolean, optional), FuelRate (IFuelRate, optional).

As a non-limiting example, TcuDevice may include the following data items: AwakeState (AwakeState, optional), BlobGuid (string, optional), CellularAndGPSType (string, optional), CellularRadio (CellularRadio, optional), ClockMode (string, optional)=['Both', 'Disabled', 'MaintainGPSLockAcrossSleep', 'AdjustDateTimeUsingPLL-RTC'], Connected State (ConnectedState, optional), DeviceTime (string, optional), EFRSupported (boolean, optional), IsFirstMessage (boolean, optional), IsLastMessage (boolean, optional), UnitStatus (string, optional)=['None', 'OTAUpdateError', 'GPSAntenaError', 'GPSSelfTestError', 'GPSTrackingDisabled'], InputState (string, optional)=['None', 'Ignition', 'Input1', 'Input2', 'Input3', 'Input4', 'Input5', 'Input6', 'Input7'], EventCode (string, optional), FtpConfiguration (FtpConfiguration, optional), FuelEfficiencyCalculationMethodWithFuelType(string, optional)=['Undefined', 'GasolineEFR', 'GasolineMAF', 'DieselEFR', 'DieselMAF'], FuelEfficiencyCoefficient (number, optional), FuelLevelSupported (boolean, optional), FuelTypeSupported (boolean, optional), GPSRadio (GPSRadio, optional), GatewayTimeStamp (string, optional), IMEI (string, optional), Id (string, optional), IngressCompleteTimeStamp (string, optional), IngressStartTimeStamp (string, optional), LastContactTime (string, optional), MAFSupported (boolean, optional), MainFirmware (Firmware, optional), MessageId (string, optional), NetworkConfiguration (NetworkConfiguration,optional), OBDFirmware (Firmware, optional), OBDProtocolDescription (string, optional), OffDuration (Duration, optional), OnDuration (Duration, optional), PartitionKey (string, optional), PowerSaveConfiguration (PowerSaveConfiguration, optional), PowerState (PowerState, optional), PowerUpCounter (integer, optional), Pre Sleep State (Pre Sleep State, optional), Profile (string, optional), ReportingIntervals (ReportingIntervals, optional), ReportingThresholds (TelematicDeviceThresholds, optional), ResetCounter (integer, optional), ResetState (ResetState, optional), RowKey (string, optional), SequenceNumber (string, optional).

Within the above examples, Acceleration may include value, units, and timestamp; Deceleration may include value(s), units, and timestamp; RPM may include value(s), units, and timestamp, IgnitionState may include value(s) and timestamp; Speed may include value(s), units, and timestamp; FuelEfficiency may include value(s), units, and timestamp; FuelLevel may include value(s), units, and timestamp; Battery may include value(s), units, timestamp, LowVoltageDuration, High VoltageDuration, BatteryResetTime, and BatteryDisconnectTime; LowVoltageDuration may include value(s) and units; HighVoltageDuration may include value(s) and units; BatteryResetTime may include value(s) and units; BatteryDisconnectDuration may include value(s) and units; Location may include timestamp, latitude, longitude, GPS status, Diluation, IsValid, and altitude; Accelerometer may include timestamp, X, Y, Z, magnitude (i.e., value(s)), units, and SamplingInterval; SamplingInterval may include value(s) and units; Heading may include direction, timestamp, value(s), and units; List of Diagnostic Codes may include Code, Description, timestamp, Severity, and Instructions; Fuel Type, FuelEfficiencyCalculationMethod, EFRScalingCoefficient, MAVScalingCoefficient, Event Code, and Sequence Number may each include value(s); Tow State may include value(s) and timestamp; Accident State may include value(s) and timestamp; Idle State may include value(s) and timestamp, Hash Event State may include value(s) and timestamp; Parked State may include value(s) and timestamp; OBDIndicators may include ABSActiveLamp Status, ABSDashStatus, AirbagDashStatus, BreakIndicatorLightStatus, Break Switch Status, CoolantHotLightStatus, CruiseControlStatus, IgnitionStatus, MILStatus, MaintenanceRquiredStatus, OilPressureLamp Status, PTOStatus, SeatbeltFastenStatus, timestamp; OBD Monitors may include ABSActiveLampStatus, ABSDashStatus, AirbagDashStatus, BreakIndicatorLightStatus, BreakSwitchStatus, CoolantHotLightStatus, CruiseControlStatus, IgnitionStatus, MILStatus, MaintenanceRquiredStatus, OilPressureLamp Status, PTOStatus, SeatbeltFastenStatus, and timestamp; OBDPidSupport may include ABSActiveLamp Status, ABSDashStatus, ACSystemRefrigerantMonitor, AirbagDashStatus, BatteryVoltage, BreakIndicatorLightStatus, BreakSwitchStatus, CANBusMode, CANBusRxcount, CANBusTxCount, CalculatedTripFuelConsumption, CalculatedTripOdometer, CatalystMonitor, ComprehensiveComponentMonitor, CoolantHotLightStatus, CoolantTemp, CruiseControlStatus, DTCCount, DerivedEngineState, EGRSystemMonitor, EngineSpeed, EvaporativeSystemMonitor, FuelEconomy, FuelLevelPercentage, FuelLevelVolume, FuelRate, FuelSystemMonitor, HeatedCatalystMonitor, IgnitionStatus, MILStatus, MaintenanceRquiredStatus, MisfireMonitor, Odometer, OilPressureLamp Status, OxygenSensorHeatedMonitor, OxygenSensorMonitor, PTOStatus, SeatbeltFastenStatus, SecondaryAirSystemMonitor, ServiceINterval-Months, ServiceIntervalDays, ServiceIntervalDistance, ThrottlePosition, TransmissionGear, Turn Signal Status, VehicleSpeed, and timestamp. TCUDevice (i.e., TelematicDevice) may include CellularAndGPSType, AwakeState (i.e., Awake_State), and CellularRadio; AwakeState may include AwakeReason, value(s), and timestamp; CellularRadio may include GSMRegistrationState, ReceiveSignalStrength, ReceiveSignalDecibelMilliwatts, ReceiveSignalQualityOfService, RemotePhoneNumber, APNOperatorName, SMSMessageOutCounter, SMSMessageInCounter, SMSSpamMessageInCounter, PercentLostGSM, PercentLostGPRS, DataOutCounter, ACKInCounter; DOTAIn, Clock Mode, Connected State, DeviceTime, EFRSupported, EventCode, FtpConfiguration, FuelEfficiencyCalculationMethodWithFuelType, FuelEfficiencyCoefficient, FuelLevelSupported, FuelTypeSupported, GPSRadio, IMEI, MAFSupported, MainFirmware, NetworkConfiguration, OBDFirmware, OBDProtocolDescription, OffDuration, OnDuration, PowerSaveConfiguration, PowerState, PowerUpCounter, PreSleepState, Profile, ReportingIntervals, Reporting Thresholds, ResetCounter, ResetState, SequenceNumber, SimChangeState, Source, VinSupported, DevideIdentifiers, OBDDatabaseFirmware, and timestamp; DataOutCounter may include value(s) and units; ACKInCounter may include value(s) and units; DOTAIn may include value(s) and units; Connected State may include value(s) and timestamp; FtpConfiguration may include Directory, RemoteHostPort, RemoteHost, Username, Password, DataMode, Retries, timestamp; GPSRadio may include NumberOfSattelitesForPositionFix, HorizontalDilutionOfPrecision, PercentLostGPS, PercentLostGPSQ, Status, LostLockTime, and timestamp; LostLockTime may include value(s), units, and timestamp; MainFirmware may include version and timestamp; NetworkConfiguration may include DNSCacheEnabledValue, DNSCacheEnabled, DNSCacheEntryTTL, NetworkSessionInterval, NetworkSessionActiveTimeout, NetworkSessionResetHeartbeat, Protocol, RemoteHost, RemoteHostPort, RemotePhoneNumber, PDPState, GPRSUsername, GPRSPasswor, GPRSOperatorName, and timestamp; DNSCacheEntryTTL may include value(s), units, and timestamp; PDPState may include ResetInterval, ActiveTimeout, ResetHeartbeatEnabled, and timestamp; OBDFirmware may include Version and timestamp; OnDuration may include value(s), units, and timestamp; PowerSaveConfiguration may include PowerSave, IgnitionOffPowerSave, LowBatteryPowerSave, BatteryDisconnectPowerSave which may each include durations, alarm times, etc. having value(s), units, and timestamp; PowerState may include value(s) and timestamp; PreSleepState may include value(s) and timestamp; ReportingIntervals may include PeriodicReportingInterval, DisconnectedBatteryReportingInterval, MainBatteryDisconnectAndReconnectAlertSetting, PeriodicHeartbeatReportInterval, PowerUpResetAndGPSLockEnabled, DeviceIdleAlertPeriod, GPSRefreshInterval, GPSRefreshDuration of which some or all may each include value(s), units, and timestamp; PeriodicReportingInterval may include IgnitionOnPeriodicInterval Setting, IgnitionOnEnableTransitionAlert, IgnitionOffPeriodicInterval Setting, IgnitionOffEnableTransitionAlert, DistanceInterval, CoordinatedDistanceAndPeriodIntervalReset, EnableUseOfMaximumSpeedReporting of which some or all may each include value(s), units, and timestamp; ReportingThresholds may include Speed, RPM, Distance, Acceleration, Deceleration, Battery, TowingThresholds, MovementThresholds, ParkTimeThreshold, AccelerometerEnabled, AccelerometerLow, AccelerometerHigh, DTCEnable, DTCReminderPeriod; ResetState may include value(s) and timestamp; SimChangeState may include value(s) and timestamp; DevideIdentifiers may include IMSI, ESN, ICCID, PhoneNumber, ApplicationId, ScriptConfigurationVersion, and timestamp; and OBDDatabaseFirmware may include Version and timestamp.

The various methods, processes, and operations described herein may be implemented by a computing system that includes one or more computing devices. These methods, processes, and operations may be implemented by hardware of the one or more computing devices executing machine-readable instructions in the form of software. Software may include programs, libraries, and other associated data.

Figure 10:
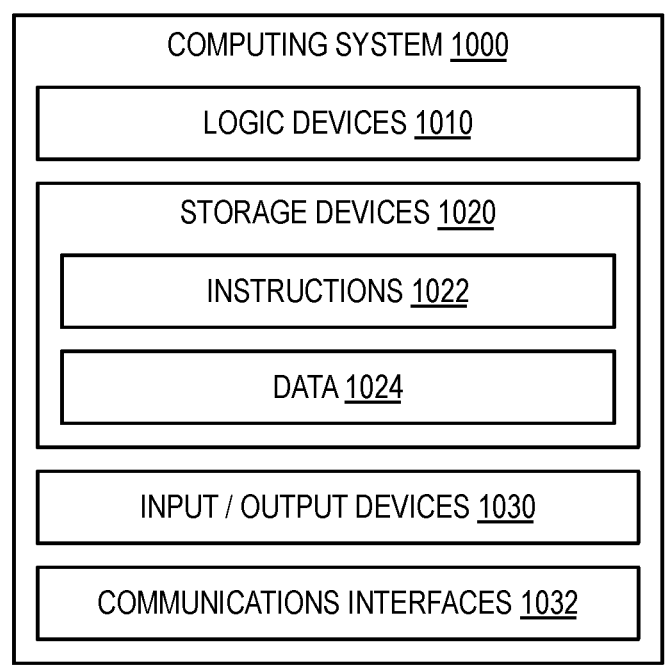
FIG. 10 is a schematic diagram depicting an example computing system.

FIG. 10 is a schematic diagram depicting an example computing system 1000 that includes one or more computing devices. Computing system 100 is a non-limiting example of computing system 100 of FIG. 1. Computing system 1000 may be configured (e.g., via instructions) to perform the methods, processes, and operations described herein. FIG. 10 depicts computing system 1000 in simplified form. A computing system or a computing device thereof may take a variety of different forms including a personal computer, a server computer, a wireless device, a personal electronic device, and/or other electronic devices that incorporate computer hardware and software.

A logic subsystem, such as example logic subsystem 1010, may include one or more physical logic devices configured to execute instructions stored or otherwise held in a storage subsystem, such as example storage subsystem 1020. For example, a logic subsystem may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

A logic subsystem may include one or more processors (as an example of physical logic devices) configured to execute software instructions, such as example instructions 1022. Additionally or alternatively, the logic subsystem may include one or more logic machines (as an example of physical logic devices) configured to execute hardcoded instructions. Processors of the logic subsystem may be single-core or multi-core. Instructions executed by the logic subsystem may be configured for sequential, parallel, and/or distributed processing. Individual components of the logic subsystem may be distributed among two or more separate devices, which may be remotely located and/or configured for coordinated processing. Aspects of the logic subsystem may be virtualized and executed by remotely accessible, networked computing devices configured in a cloud-computing configuration.

A storage subsystem includes one or more physical memory devices configured to hold instructions or other forms of data. These one or more physical memory devices may take the form of non-transitory memory devices configured to hold instructions or other forms of data in non-transitory form. As previously discussed, instructions are executable by a logic subsystem, to implement the methods, processes, and operations described herein. While instructions may be held in non-transitory form, such non-transitory instructions may be updated from time to time to add, remove, or modify the methods, processes, and operations performed by the computing device upon execution of the instructions. While a storage subsystem includes one or more physical devices, aspects of the instructions and/or other forms of data described herein may, at times, be propagated by a communication medium (e.g., an electromagnetic signal, an optical signal, etc.) that is not necessarily held by a physical device for a finite duration.

Aspects of a logic subsystem and a storage subsystem may be integrated together into one or more hardware-logic components. Such hardware-logic components may include field-programmable gate arrays (FPGAs), program-specific and application-specific integrated circuits (PASIC/ASICs), program-specific and application-specific standard products (PSSP/ASSPs), system-on-a-chip (SOC), and complex programmable logic devices (CPLDs), for example.

One or more physical memory devices of a storage subsystem may be configured to hold other forms of data in a data store or data storage. When the methods, processes, or operations described herein are implemented, the state of the storage subsystem may be transformed—e.g., to hold different data. A storage subsystem may include removable and/or built-in devices. A storage subsystem may include optical memory devices, semiconductor memory devices, and/or magnetic memory devices, among other suitable forms. A storage subsystem may include volatile, nonvolatile, dynamic, static, read/write, read-only, random-access, sequential-access, location-addressable, file-addressable, and/or content-addressable devices.

Terms such as "module" or "program," may be used to describe an aspect of a computing system implemented to perform a particular function. In some cases, a module or program may be instantiated via a logic subsystem executing instructions held by a storage subsystem. It will be understood that different modules and/or programs may be instantiated from the same application, service, code block, object, library, routine, API, function, etc. Likewise, the same module and/or program may be instantiated by different applications, services, code blocks, objects, routines, APIs, functions, etc. The terms module and program may encompass individual or groups of executable files, data files, libraries, drivers, scripts, database records, etc. The term service may be used refer to an application program, module, or other instruction set executable across multiple sessions, e.g., of a user account. A service may be available to one or more system components, programs, and/or other services. In some implementations, a service may run on one or more server-computing devices—i.e., a server system.

Computing system 1000 may further include or interface with one or more input and/or output devices 1030. Non-limiting examples of input devices include a sensor, a touch-sensitive graphical display device, a keyboard, a computer mouse, a microphone, an optical sensor, an accelerometer/gyro/inertial sensor, etc. Non-limiting examples of output devices include a graphical display device, an audio speaker, a haptic feedback device, etc.

Computing system 1000 may further include one or more communications interfaces 1032. Non-limiting examples of communications interfaces include wired and/or wireless communications interfaces that support wired and/or wireless communications over wide area networks, local area networks, or personal area networks using any suitable communications protocol, including OBD protocols, cellular protocols, WLAN protocols, Internet protocols, etc.

As described herein, a variety of information in the form of data may be measured, collected, received, stored, retrieved from storage, processed, analyzed, organized, formatted, copied, reported, and/or transmitted in raw and/or processed forms. Data includes a set of one or more values (i.e., data values) of one or more parameters or variables. Such values may be quantitate or qualitative in nature. Data may be represented by one or more physical quantities, attributes, or characteristics of one or more signals or object states.

An object state refers to a physical state of a tangible, physical object, such as a device or machine. Within the context of a computing system or other electronic system, an object state may include a value of a bit stored in a memory cell or other suitable bistable/multistable electronic circuit (e.g., flip-flop or latch) of a memory device. As an example, a value of a bit may be defined by a high or low physical voltage value of a memory cell, corresponding to values of 1 or 0 for the bit, respectively.

Data represented by one or more signals (i.e., data signals) may be propagated by a communication medium, in the form of electrical signals, electromagnetic signals, optical signals, etc. Data signals may be communicated over one or more wired and/or wireless communications links or paths. Data signals may take the form of or form part of a modulated signal or a non-modulated signal. Data signals may be formatted or otherwise organized into one or more messages, streams, packets, datagrams, and/or frames as defined by one or more communications protocols.

Data may be represented in a variety of digital and/or analog forms. Within the context of digital data, an object state or signal component representing an individual data unit may be observed or identified as having a discrete value of two or more discrete values. Within the context of analog data, an object state or signal component representing an individual data unit may be observed or identified as having a value within a range of non-quantized values.

A collection of data may take the form of a set instructions that are executable by a machine to perform one or more operations. Such instructions may be referred to as machine-readable instructions that direct the machine to perform one or more operations. A set of instructions may take the form of software or a portion thereof (e.g., a software component). Software may include firmware, an operating system, an application program or other program type, a software plug-in, a software update, a software module, a software routine, or other software component.

An organized collection of data may take the form of a database system or other suitable data structure (e.g., an electronic file). A database system includes one or more databases that define relationships and associations between and among data objects. As an example, a data object (e.g., a user account identifier) that includes a set of one or more data values may be associated with one or more other data objects (e.g., a user setting). A database system may be integrated with or form part of a software component.

Data may include metadata that describes other data. Metadata describing the structure of other data, such as a relationship or association of data objects in a database may be referred to as structural metadata. Metadata describing the content of other data may be referred to as guide metadata. A collection of data may include metadata and other data described by that metadata.

It will be understood that the configurations and/or approaches described herein are exemplary in nature, and that these specific examples or implementations are not to be considered in a limiting sense, because numerous variations are possible. The specific methods described herein may represent one or more of any number of processing strategies. As such, various acts illustrated and/or described may be performed in the sequence illustrated and/or described, in other sequences, in parallel, or omitted. Likewise, the order of the above-described methods may at times be changed.

The subject matter of the present disclosure includes all novel and nonobvious combinations and subcombinations of the various configurations, approaches, systems, methods, and other features, functions, acts, and/or properties disclosed herein, as well as any and all equivalents thereof.

The invention claimed is:

1. A computer-implemented method performed by a computing system for testing vehicle telematics application programs, the method comprising:
    receiving, at a vehicle telematics simulator of a vehicle telematics simulator program executed at a client computing device, user input defining a set of parameters for a simulation of one or more vehicle telematics events;
    performing the simulation of the one or more vehicle telematics events at the vehicle telematics simulator executed at the client computing device to generate simulation data based, at least in part, on the set of parameters;
    formatting, via the vehicle telematics simulator executed at the client computing device, the simulation data generated by the vehicle telematics simulator according to a reporting protocol to obtain formatted simulation data;
    providing the formatted simulation data to a vehicle telematics service hosted at a server system, by the client computing device transmitting the formatted simulation data directed to the vehicle telematics service over a wide-area communications network, for processing by the vehicle telematics service;
    obtaining the formatted simulation data at the vehicle telematics service hosted at the server system over the wide-area communications network;
    obtaining, at the vehicle telematics service hosted at the server system, formatted measurement data representing measurements of real-world vehicle telematics events generated by a vehicle-based telematics device residing on-board a vehicle, the formatted measurement data formatted by the vehicle-based telematics device according to the reporting protocol from raw measurement data obtained from sensors on-board the vehicle over an on-board diagnostics interface of the vehicle, and transmitted by the vehicle-based telematics device over a wireless network component of the wide-area communications network for processing of the formatted measurement data by the vehicle telematics service;
    processing the formatted simulation data and the formatted measurement data via a common processing pipeline of the vehicle telematics service to obtain a first set of processed data representing a processed form of the formatted simulation data and a second set of processed data representing a processed form of the formatted measurement data;
    transmitting the first set of processed data, over the wide-area communications network, from the server system to a computing device of a first subscriber executing a vehicle telematics application program being tested by an application developer for use by the vehicle telematics application program; and
    transmitting the second set of processed data from the server system to a second subscriber over the wide-area communications network.

2. The method of claim 1, wherein the user input is received
    via a graphical user interface of the vehicle telematics simulator program executed by the client computing device; and
    wherein the computing device of the first subscriber is the client computing device that executes the vehicle telematics simulator program.

3. The method of claim 2, further comprising:
    storing the set of parameters defined by the user input at a storage subsystem of the client computing device accessible to the vehicle telematics simulator; and
    storing the simulation data and/or the formatted simulation data at the storage subsystem of the client computing device accessible to the vehicle telematics simulator.

4. The method of claim 1, wherein providing the formatted simulation data to the vehicle telematics service includes associating an identifier with the formatted simulation data, the identifier further associated with the first subscriber in a database system of the vehicle telematics service.

5. The method of claim 1, wherein the set of parameters for the simulation includes a plurality of parameters in which each parameter includes a parameter type and one or more values for that parameter type.

6. The method of claim 5, wherein the user input defining the set of parameters includes user input defining at least one parameter value for a parameter type.

7. The method of claim 5, wherein the parameter types of the set of parameters include one or more of a vehicle speed, an engine RPM, a fuel level, a fuel efficiency, a battery charge level, an events parameter type, a travel route parameter type.

8. The method of claim 5, wherein the one or more parameter values include a value range for at least some of the parameter types.

9. The method of claim 8, further comprising:
    at the vehicle telematics simulator, generating a set of vehicle states based on the set of parameters; and wherein performing the simulation of vehicle telematics events includes performing a simulation for each vehicle state of the set of vehicle states.

10. The method of claim 8, wherein generating the set of vehicle states includes generating a plurality of vehicle states for each parameter across a range of parameter values for that parameter.

11. A computing system, comprising:
a plurality of computing devices configured to:
at a client computing device of the plurality of computing devices, execute a vehicle telematics simulator program to instantiate a vehicle telematics simulator;
receive, at the vehicle telematics simulator executed at the client computing device, user input defining a set of parameters for a simulation of one or more vehicle telematics events to be used in testing of a vehicle telematics application program by an application program developer;
perform the simulation of the one or more vehicle telematics events at the vehicle telematics simulator executed at the client computing device to generate simulation data based, at least in part, on the set of parameters;
format, via the vehicle telematics simulator executed at the client computing device, the simulation data generated by the vehicle telematics simulator according to a reporting protocol to obtain formatted simulation data;
transmit the formatted simulation data from the client computing device over a wide-area communications network directed to a vehicle telematics service hosted at a server system including one or more other computing devices of the plurality of computing devices for processing by the vehicle telematics service;
obtain the formatted simulation data at the vehicle telematics service hosted at the server system over the wide-area communications network;
obtain, at the vehicle telematics service hosted at the server system, formatted measurement data representing measurements of real-world vehicle telematics events generated by a vehicle-based telematics device residing on-board a vehicle, the formatted measurement data formatted by the vehicle-based telematics device according to the reporting protocol from raw measurement data obtained from sensors on-board the vehicle over an on-board diagnostics interface of the vehicle, and transmitted by the vehicle-based telematics device over a wireless network component of the wide-area communications network for processing of the formatted measurement data by the vehicle telematics service;
process the formatted simulation data and the formatted measurement data via a common processing pipeline of the vehicle telematics service to obtain a first set of processed data representing a processed form of the formatted simulation data and a second set of processed data representing a processed form of the formatted measurement data;
transmit the first set of processed data, over the wide-area communications network, from the server system to a computing device of a first subscriber executing the vehicle telematics application program being tested for use by the vehicle telematics application program; and
transmit the second set of processed data from the server system to a second subscriber over the wide-area communications network.

12. The computing system of claim 11, wherein the user input is received via a graphical user interface of the vehicle telematics simulator program executed by the client computing device; and
wherein the computing device of the first subscriber is the client computing device that executes the vehicle telematics simulator program.

13. The computing system of claim 12, wherein the set of parameters defined by the user input are stored at a storage subsystem of the client computing device accessible to the vehicle telematics simulator; and
wherein the simulation data and/or the formatted simulation data is stored at the storage subsystem of the client computing device accessible to the vehicle telematics simulator.

14. The computing system of claim 13, wherein the formatted simulation data is transmitted to the vehicle telematics service by associating an identifier with the formatted simulation data, the identifier further associated with the first subscriber in a database system of the vehicle telematics service.

15. The computing system of claim 11, wherein the set of parameters for the simulation includes a plurality of parameters in which each parameter includes a parameter type and one or more values for that parameter type.

16. The computing system of claim 15, wherein the user input defining the set of parameters includes user input defining at least one parameter value for a parameter type.

17. The computing system of claim 15, wherein the parameter types of the set of parameters include one or more of a vehicle speed, an engine RPM, a fuel level, a fuel efficiency, a battery charge level, an events parameter type, a travel route parameter type.

18. The computing system of claim 15, wherein the one or more parameter values include a value range for at least some of the parameter types.

19. The computing system of claim 18, wherein the vehicle telematics simulator generates a set of vehicle states based on the set of parameters; and
wherein the simulation of vehicle telematics events is performed by includes performing a simulation for each vehicle state of the set of vehicle states.

20. The computing system of claim 18, wherein generating the set of vehicle states includes generating a plurality of vehicle states for each parameter across a range of parameter values for that parameter.

* * * * *